(12) United States Patent
Kishimoto et al.

(10) Patent No.: US 10,513,770 B2
(45) Date of Patent: Dec. 24, 2019

(54) VAPOR DEPOSITION APPARATUS, VAPOR DEPOSITION METHOD AND METHOD OF MANUFACTURING ORGANIC EL DISPLAY APPARATUS

(71) Applicant: Sakai Display Products Corporation, Osaka (JP)

(72) Inventors: Katsuhiko Kishimoto, Osaka (JP); Susumu Sakio, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

(21) Appl. No.: 16/522,318

(22) Filed: Jul. 25, 2019

(65) Prior Publication Data

US 2019/0345598 A1 Nov. 14, 2019

Related U.S. Application Data

(63) Continuation of application No. 15/757,437, filed as application No. PCT/JP2017/029815 on Aug. 21, 2017, now Pat. No. 10,422,029.

(51) Int. Cl.
| | | |
|---|---|---|
| *C23C 14/04* | (2006.01) | |
| *H01L 27/32* | (2006.01) | |
| *H01L 51/00* | (2006.01) | |
| *H01L 51/56* | (2006.01) | |
| *C23C 14/24* | (2006.01) | |
| *C23C 14/50* | (2006.01) | |

(52) U.S. Cl.
CPC ............ *C23C 14/042* (2013.01); *C23C 14/24* (2013.01); *C23C 14/50* (2013.01); *H01L 27/3244* (2013.01); *H01L 51/0011* (2013.01); *H01L 51/56* (2013.01); *H01L 2227/323* (2013.01)

(58) Field of Classification Search
CPC ....... C23C 14/042; C23C 14/50; C23C 14/24; H01L 27/3244; H01L 51/56
See application file for complete search history.

(56) References Cited

U.S. PATENT DOCUMENTS

2010/0112194 A1 5/2010 Inoue et al.

FOREIGN PATENT DOCUMENTS

| | | |
|---|---|---|
| JP | H10152776 A | 6/1998 |
| JP | 2003187973 A | 7/2003 |
| JP | 2007131935 A | 5/2007 |
| JP | 2008024956 A | 2/2008 |
| JP | 2010086809 A | 4/2010 |
| WO | 2009118888 A1 | 10/2009 |

OTHER PUBLICATIONS

English Translation of International Search Report, PCT Application No. PCT/JP2017/029815, Japan Patent Office, dated Nov. 21, 2017.

*Primary Examiner* — Seahvosh Nikmanesh
(74) *Attorney, Agent, or Firm* — Marsh Fischmann & Breyfogle LLP

(57) ABSTRACT

Provided are a vapor deposition apparatus, a vapor deposition method, and a method of manufacturing an organic EL display apparatus which can prevent heat generation of a magnet chuck by using the magnet chuck that strongly attracts a deposition mask to dispose a substrate for vapor deposition and the deposition mask in proximity to each other during vapor deposition, while being less influenced by any magnetic field during alignment between the substrate for vapor deposition and the deposition mask. In the vapor deposition apparatus, a magnet chuck (3) includes a permanent magnet (3A) and an electromagnet (3B).

17 Claims, 9 Drawing Sheets

VAPOR DEPOSITION APPARATUS, VAPOR DEPOSITION METHOD AND METHOD OF MANUFACTURING ORGANIC EL DISPLAY APPARATUS

CROSS-REFERENCE TO RELATED APPLICATIONS

This patent application is a continuation patent application of co-pending U.S. application Ser. No. 15/757,437, having a filing/§ 371(c) date of Jun. 27, 2018, which is a U.S. National Stage of PCT/JP2017/029815, having an international filing date of Aug. 21, 2017. The entire disclosure of each patent application set forth in this CROSS-REFERENCE TO RELATED APPLICATIONS section is hereby incorporated by reference.

TECHNICAL FIELD

The present invention relates to a vapor deposition apparatus which is suitable for vapor-depositing organic layers of an organic EL display apparatus, a vapor deposition method, and a method of manufacturing an organic electro-luminescence (EL) display apparatus, for example.

BACKGROUND ART

For example, when an organic EL display apparatus is manufactured, a driving element, such as a thin-film-transistor (TFT), a planarizing layer, and an electrode are formed on a support substrate, and organic layers are deposited on the electrode for each pixel. The organic layers are susceptible to moisture and thus cannot be etched. For this reason, the organic layers are deposited by overlapping and arranging a deposition mask on the support substrate (substrate for vapor deposition) and then vapor-depositing organic materials through openings formed in the deposition mask. Consequently, necessary organic materials are deposited only on the electrodes of required pixels. The substrate for vapor deposition and the deposition mask must be positioned as close as possible. Otherwise, the organic layer only on the accurate area of the pixel cannot be formed. If the organic material is not deposited exclusively on the accurate area of the pixel, a displayed image is more likely to become unclear. As such, a magnet chuck is utilized to place the substrate for vapor deposition and a deposition mask close to each other by using a magnetic material as the deposition mask and interposing the substrate for vapor deposition between a permanent magnet or an electromagnet and the deposition mask (for example, see Patent Document 1).

PRIOR ART DOCUMENT

Patent Document

Patent Document 1: JP 2008-024956 A

SUMMARY OF THE INVENTION

Problem to be Solved by the Invention

Although a metal mask is conventionally used as the deposition mask, in order to form finer openings, a hybrid-type deposition mask tends to be used nowadays. In the hybrid-type deposition mask, the surroundings of openings of the mask formed of a resin film are supported by a metal support layer. The deposition mask with a small amount of magnetic material, such as the hybrid mask, cannot sufficiently exhibit attraction unless it is under a stronger magnetic field (magnetic force).

As mentioned above, a permanent magnet or an electromagnet is used as the magnet chuck. Nevertheless, as a permanent magnet constantly generates a magnetic field, the magnetic field also acts even when the substrate for vapor deposition and the deposition mask are aligned with each other before vapor deposition. Thus, if the magnetic field is strong, the deposition mask is attracted to the substrate for vapor deposition at the time of alignment, which makes it difficult to move and align only one of the substrate for vapor deposition or the deposition mask with the other. To perform the alignment with little influence of the magnetic field, it is necessary to place the permanent magnet far away from the deposition mask and the substrate for vapor deposition. However, if the alignment is performed after placing the permanent magnet at a far-away position, and then the permanent magnet is moved closer to the substrate for vapor deposition again, the deposition mask may be displaced laterally and attracted to the permanent magnet during its movement. If the deposition mask is misaligned when moving the permanent magnet closer thereto, fine vapor deposition cannot be performed. Furthermore, if a magnetic field of the permanent magnet is present when attaching or detaching the deposition mask, there is a problem that work required is difficult to perform.

Meanwhile, when an electromagnet is used, the magnetic field is almost set to zero by turning off the application of current to a coil of the electromagnet, whereas the magnetic field can be generated and used for attraction by the application of current. Thus, at the time of alignment and the like, the magnetic field is not applied, and after alignment, the magnetic field can be applied, which facilitates the alignment between the substrate for vapor deposition and the deposition mask, attachment and detachment of the deposition mask, and the like. Furthermore, the magnetic field can be generated only by the application of current without moving the electromagnet. For this reason, even when the magnetic field is generated after the alignment, neither the deposition mask nor the substrate for vapor deposition will move at all, so that the deposition mask and the substrate for vapor deposition can be held at precise positions.

However, to generate a large magnetic field when attracting the deposition mask using the electromagnet, it is necessary to increase the current or increase the number of turns of the coil. This is because the strength of the magnetic field of the electromagnet is proportional to the product of the number of turns of the coil of the electromagnet and the current flowing through the coil. For this reason, when the current or the number of turns of the coil is increased to strengthen a magnetic field, the amount of generated heat would be increased in either case. As a large current is allowed to flow through the coil of the electromagnet, an electrical wire having a small resistance is originally used for the coil of the electromagnet. However, an aluminum wire, but not a copper wire, tends to be used from the viewpoint of cost, and hence the electromagnet generates heat more due to an increase of resistance loss in the wire. Further, when a core (iron core) is used for the electromagnet, the generated magnetic field can be increased, but eddy current occurs in the core, and thereby heat is also generated by the eddy current.

Meanwhile, once heat generation occurs, the heat is transferred to the substrate for vapor deposition and the deposition mask, thus increasing the temperatures of the substrate for vapor deposition and the deposition mask. The substrate for vapor deposition and the deposition mask are made of different materials and hence have different coefficients of linear expansion. For example, when a difference in the coefficient of linear expansion between the substrate for vapor deposition and the deposition mask is 3 ppm/° C., a length difference of 3 µm per degree in a length of a display panel having a length of 1 m, from an edge to another edge, occurs between the substrate for vapor deposition and the deposition mask. For example, assuming that the size of one pixel is 60 µm on one side, it is considered that only a pixel displacement up to about 15% is allowed at a resolution of 5.6 k. Thus, the pixel displacement due to the difference in the coefficient of thermal expansion should be limited to 9 µm. In the above-mentioned example, a temperature increase of 1° C. leads to a difference in the size of 3 µm, and therefore the temperature increase is limited to 3° C. That is, the temperature increase in each of the substrate for vapor deposition and the deposition mask because of a temperature increase of the electromagnet needs to be suppressed to 3° C. or less.

The present invention has been made to solve these problems, and it is an object of the present invention to provide a vapor deposition apparatus and a vapor deposition method which can prevent a temperature increase of a deposition mask and the like due to a magnet chuck, by using the magnet chuck that strongly attracts the deposition mask to dispose the substrate for vapor deposition and the deposition mask in proximity to each other during vapor deposition, while being less influenced by the magnetic field during alignment between the substrate for vapor deposition and the deposition mask.

It is another object of the present invention to provide a method of manufacturing an organic EL display apparatus which exhibits excellent display quality by using the above-mentioned vapor deposition method.

Means to Solve the Problem

A vapor deposition apparatus according to a first embodiment of the present invention comprises: a mask holder for holding a deposition mask including a magnetic material; a substrate holder for holding a substrate for vapor deposition so as to dispose the substrate for vapor deposition in proximity to the deposition mask held by the mask holder; a vapor deposition source provided on a position facing a surface of the deposition mask opposite to the substrate for vapor deposition and spaced apart from the deposition mask, the vapor deposition source being adapted to vaporize or sublimate a vapor deposition material; and a magnet chuck provided on a position facing a surface of the substrate for vapor deposition held by the substrate holder, the surface being opposite to the deposition mask, the magnet chuck being adapted to attract the deposition mask by a magnetic force, wherein the magnet chuck comprises a permanent magnet and an electromagnet.

A vapor deposition method according to a second embodiment of the present invention comprises: a step of overlaying a deposition mask including a magnetic material, a substrate for vapor deposition, and a magnet chuck for attracting the deposition mask, and disposing the substrate for vapor deposition and the deposition mask in proximity to each other by the attraction of the deposition mask by using the magnet chuck; and a step of depositing a vapor deposition material on the substrate for vapor deposition by vaporizing or sublimating the vapor deposition material from a vapor deposition source spaced apart from the deposition mask, wherein the magnet chuck comprises a permanent magnet and an electromagnet, when the substrate for vapor deposition and the deposition mask are aligned with each other, the alignment is performed while applying a magnetic field in a reverse orientation relative to an orientation of a magnetic field of the permanent magnet, by using the electromagnet so as to weaken the magnetic field of the permanent magnet, and after the alignment, the deposition mask is attracted by the permanent magnet by turning off the magnetic field of the electromagnet.

A method of manufacturing an organic EL display apparatus according to a third embodiment of the present invention comprises: forming at least a TFT and a first electrode on a support substrate; forming an organic deposition layer by depositing organic materials over a surface of the support substrate using the vapor deposition method mentioned above; and forming a second electrode on the organic deposition layer.

Effects of the Invention

According to the vapor deposition apparatus and the vapor deposition method according to the first and second embodiments of the present invention, the magnet chuck includes the permanent magnet and the electromagnet. Thus, when the alignment between the substrate for vapor deposition and the deposition mask is performed, the magnetic field of the permanent magnet is weakened by the electromagnet, whereby the alignment can be performed while being less influenced by the magnetic field. After the alignment, by turning off the electromagnet, the deposition mask can be sufficiently attracted by the permanent magnet. Therefore, during the vapor deposition, the electromagnet does not operate and hence does not generate heat, so that the deposition mask can be attracted by the strong magnetic field of the permanent magnet. Consequently, the thermal expansion of the substrate for vapor deposition and the deposition mask can also be suppressed. Further, the accurate deposition pattern can be obtained. As a result, even when depositing the organic layers, the accuracy of the vapor deposition thereof is improved, so that the vapor deposition can be performed in the accurate pattern. By applying the vapor deposition apparatus and vapor deposition method to the manufacturing of the organic EL display apparatus, the display panel with high definition can be obtained through the formation of fine pixels.

BRIEF DESCRIPTION OF THE DRAWINGS

FIG. 7A is a diagram showing an example of a driving device for a deposition mask or the like;

EMBODIMENT FOR CARRYING OUT THE INVENTION

Figure 1:
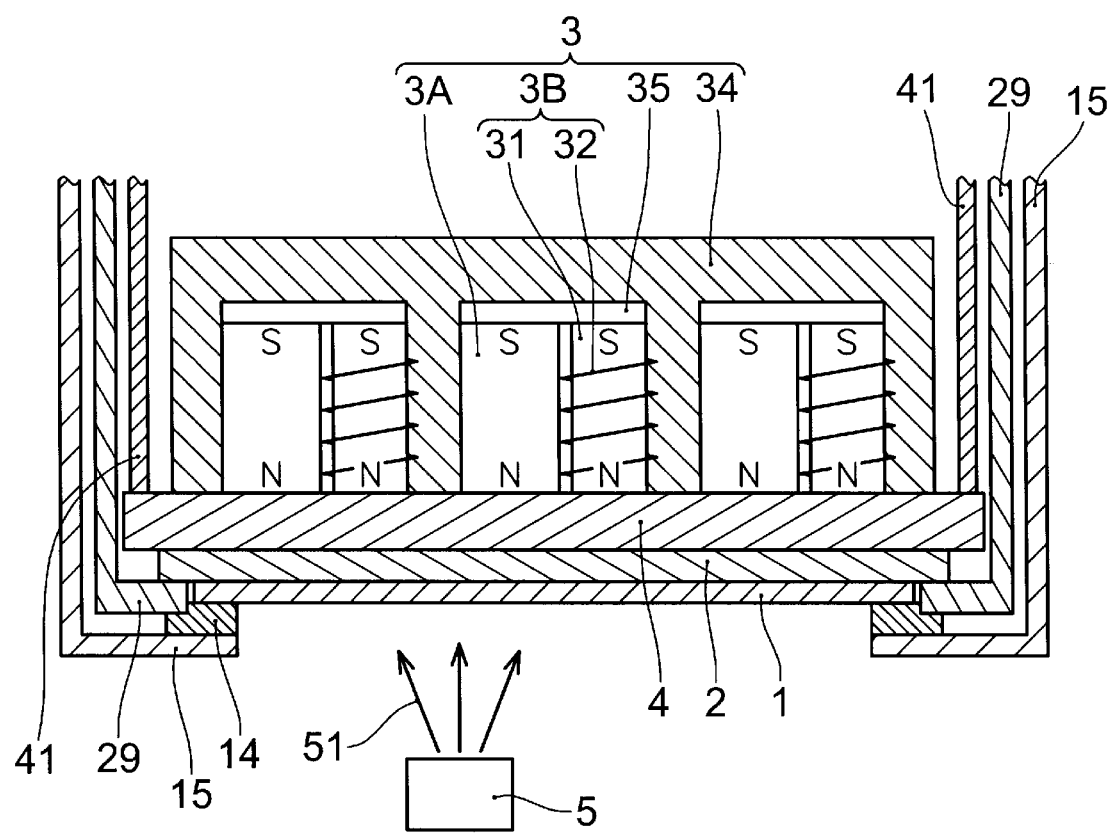
FIG. 1 is a diagram schematically showing a vapor deposition apparatus according to an embodiment of the present invention.

Hereinafter, vapor deposition apparatuses and vapor deposition methods according to first and second embodiments of the present invention will be described with reference to the accompanying drawings. As illustrated in FIG. 1, the vapor deposition apparatus of the present embodiment includes: a mask holder 15 for holding a deposition mask 1 having a magnetic material; a substrate holder 29 for holding a substrate for vapor deposition 2 so as to dispose the substrate for vapor deposition 2 in proximity to the deposition mask 1 held by the mask holder 15; a vapor deposition source 5 provided on a position facing a surface of the deposition mask 1 opposite to the substrate for vapor deposition 2 and spaced apart from the deposition mask 1, the vapor deposition source being adapted to vaporize or sublimate a vapor deposition material 51; and magnet chucks 3 provided on a position facing a surface of the substrate for vapor deposition 2 held by a substrate holder 29, the surface being opposite to the deposition mask 1, the magnet chucks 3 being adapted to attract the deposition mask 1 by a magnetic force, wherein the magnet chucks 3 includes a permanent magnet 3A and an electromagnet 3B. The mask holder 15, the substrate holder 29, and the like are not illustrated precisely in FIG. 1, but are movable vertically by a driving device 6 (not illustrated in FIG. 1) at their tip ends, for example, as described later with reference to FIG. 7A.

(Magnet Chuck)

Although the schematic structure of the vapor deposition apparatus will be described later, in the vapor deposition apparatus of the embodiment shown in FIG. 1, the deposition mask 1 and the substrate for vapor deposition 2 are disposed side by side vertically. A vapor deposition material is deposited on the substrate for vapor deposition 2 in accordance with a pattern formed by openings of the deposition mask 1. For this reason, close contact between the deposition mask 1 and the substrate for vapor deposition 2 is convenient from the viewpoint of accurately transferring the pattern of the deposition mask 1 to the substrate for vapor deposition 2. To obtain the close contact (satisfactory accessibility), a method has been conventionally used in which a magnet made of a permanent magnet or an electromagnet is disposed above a surface of the substrate for vapor deposition 2 opposite to the deposition mask 1, and the deposition mask 1 including a magnetic material is attracted by a magnetic force of the magnet. That is, in the conventional method, only one of a permanent magnet or an electromagnet is used in the magnetic attraction method. However, as described above, each of both types of magnets has advantages and disadvantages respectively.

In the present embodiment, both a permanent magnet 3A and an electromagnet 3B are provided as magnetic force generating means in the magnet chuck 3 for the magnetic attraction. Here, when attracting the deposition mask during vapor deposition, only the permanent magnet 3A is used for the attraction. On the other hand, in a case where the attraction is not required, such as when disposing the substrate for vapor deposition 2 and the like or when aligning the substrate for vapor deposition 2 and the deposition mask 1, the electromagnet 3B is also used to generate another magnetic field oriented in the direction opposite to the orientation of the magnetic field of the permanent magnet 3A, thereby weakening the existing magnetic field acting on the deposition mask 1. In other words, the magnet chuck 3 of the present embodiment has an attraction structure that attracts the deposition mask 1 by the permanent magnet 3A and can weaken the magnetic field of the permanent magnet 3A by using the electromagnet when the magnetic field is unnecessary. The term of the magnet chuck 3 as used herein includes the permanent magnet 3A, the electromagnet 3B, a covering member 34, a yoke 33 to be described later (see FIG. 4), and the like. It should be noted that the electromagnet 3B includes a core 31 and a coil 32. As the permanent magnet 3A, a normal permanent magnet can be used, but a permanent magnet having a large coersive force is preferable. The electromagnet 3B can be made only by the coil 32 which is an electrical wire is wound, but the core (iron core) 31 made of iron or the like is preferably provided inside the coil 32 because the magnetic field can be strengthened.

Figure 2:
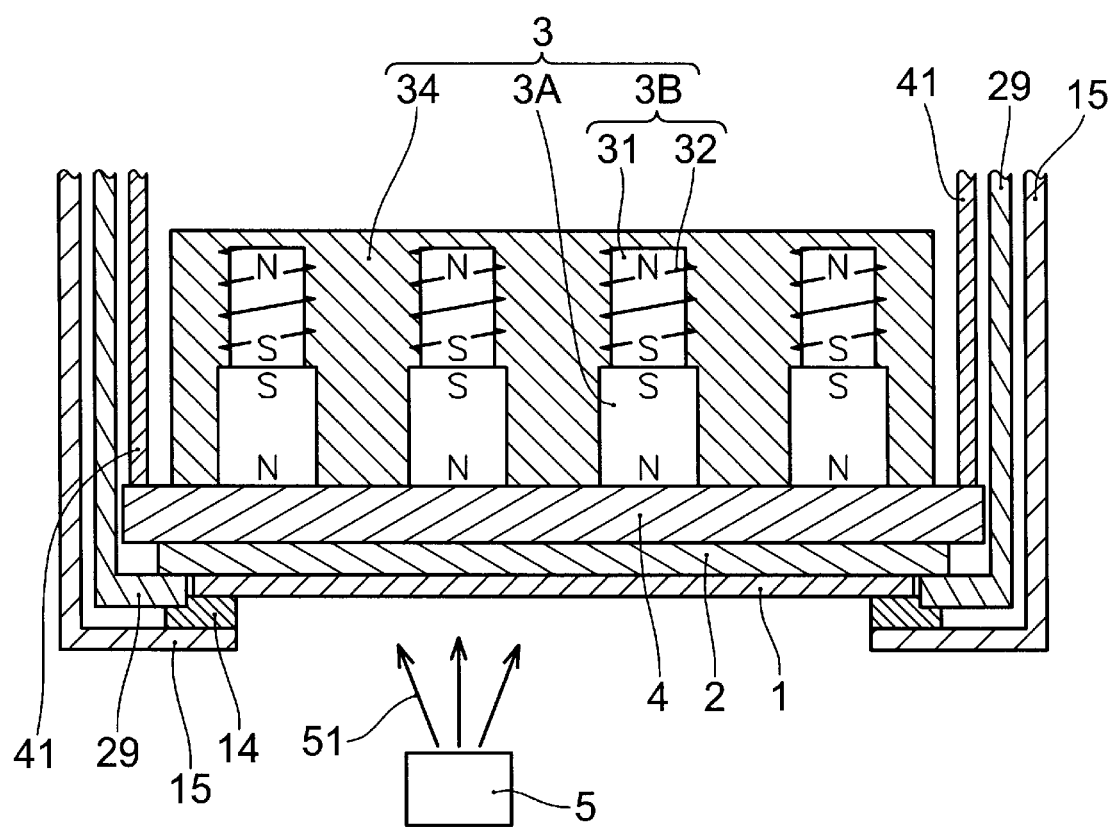
FIG. 2 is a schematic diagram of a vapor deposition apparatus according to another example of the vapor deposition apparatus shown in FIG. 1.

Regarding the arrangement of the permanent magnet 3A and the electromagnet 3B, as shown in FIG. 1, the permanent magnets 3A and the electromagnets 3B may be arranged side by side in the lateral direction (in the direction parallel to the surface of the deposition mask 1). Alternatively, as shown in FIG. 2, the permanent magnet 3A and the electromagnet 3B may be arranged side by side in the axial direction of the permanent magnet 3A (in the direction perpendicular to the surface of the deposition mask 1). For the structure shown in FIG. 1, ends of the permanent magnet 3A and the electromagnet 3B, located at the respective surfaces thereof opposite to the deposition mask 1, are preferably connected together by a magnetic plate 35 made of a soft magnetic material. Especially, the soft magnetic material is preferable because it has such a small coercive force and a large magnetic permeability that the magnetization by the electromagnet 3B is less likely to remain. Examples of the soft magnetic material include iron, silicon steel (which is iron with a small amount of Si added thereto and no carbon contained), and the like, which are relatively inexpensive and particularly preferable as the magnetic plate 35 of the present embodiment. Other examples of the soft magnetic material include permalloy (an alloy of Ni and Fe) and the like.

By flowing the current through the coil of the electromagnet 3B to produce polarities shown in the figure while the permanent magnet 3A and the electromagnet 3B are connected together by the magnetic plate 35, magnetic field lines in the reverse orientation are generated in the permanent magnet 3A and the electromagnet 3B to thereby weaken the magnetic field of the permanent magnet 3A. Alternatively, these respective polarities may be reversed those shown in the figure. For the arrangement shown in FIGS. 1 and 2, as the permanent magnet 3A and the electromagnet 3B repel each other, both the permanent magnet 3A and the electromagnet 3B need to be surely fixed together by the covering material 34 or the like not to be separated from each other.

Further, when the permanent magnets 3A and the electromagnets 3B are arranged side by side as shown in FIG. 1, the magnetic plate 35 may be removed, and the electromagnets 3B may be arranged to surround the permanent magnets 3A such that the electromagnets 3B are located as close as possible to the permanent magnets 3A. In this case, the polarity of the electromagnet 3B is set different from the polarity of the permanent magnet 3A, and for example, the polarity of the surface of the electromagnet 3B facing a touch plate 4 needs to be set at S to the polarity N of the surface of the permanent magnet 3A facing the touch plate 4 shown in FIG. 1. In this way, the polarity of the permanent magnet 3A can be weakened, though it cannot be completely cancelled. As a structure obviously showing this case, a magnetic field oriented in the reverse direction relative to the magnetic field of the permanent magnet 3A can also be generated by winding an electrical wire around the rod-shaped permanent magnet 3A, or winding a coil 32 around a cylindrical body to cover the permanent magnet 3A. Consequently, the magnetic field of the permanent magnet 3A and the magnetic field of the electromagnet 3B become coaxial and are easily cancelled each other. It should be noted that only the coil 32 without the core 31 can configure the electromagnet 3B. The polarity of the above-mentioned electromagnet 3B at its tip in the orientation at which a right screw travels based on the right hand screw rule becomes the N pole, depending on the orientation of a current flowing through the coil 32 of the electromagnet 3B. Therefore, the orientation of the magnetic field of the electromagnet 3B can be set free by adjusting the orientation of the current depending on the orientation of the permanent magnet 3A.

The application of the voltage is changed by a control circuit of a power supply circuit (not shown), so that the orientation of the magnetic field can be selected. The intensity of the magnetic field by the electromagnet 3B does not need to completely cancel the magnetic field of the permanent magnet 3A, and may be about one-tenth (1/10) or more and about one-half (1/2) or less of the intensity of the magnetic field of the permanent magnet 3A. This is because its purpose is to weaken a strong attraction force at the time of alignment, or the like.

As described above, both the permanent magnet 3A and the electromagnet 3B are arranged to generate their reverse magnetic fields. Thus, once the electromagnet 3B is operated, the magnetic field of the permanent magnet 3A is cancelled. Consequently, the electromagnet 3B can be operated to weaken the influence of the magnetic field when the substrate for vapor deposition 2 or the deposition mask 1 are replaced or when the substrate for vapor deposition 2 and the deposition mask 1 are aligned. Meanwhile, after the completion of the alignment between the substrate for vapor deposition 2 and the deposition mask 1, the application of current onto the electromagnet 3B is turned off, and only the permanent magnet 3A is operated. In this way, the magnetic field can be strengthened only by an operation of the power source without moving the magnet chuck 3. Once the current in the electromagnet 3B is turned off in the structure shown in FIGS. 1 and 2, the N and S poles shown in FIGS. 1 and 2 eliminated from the electromagnet 3B, and thereby the core 31 of the electromagnet 3B acts merely as the magnetic material. As a result, the structure shown in FIG. 1 has the same function as a horseshoe-shaped permanent magnet and applies the strong magnetic field of the permanent magnet 3A to the deposition mask 1. In the structure shown in FIG. 2, the S pole is generated on the surface of the core 31 opposite to the permanent magnet 3A. Consequently, the magnet chuck 3 hardly needs to be moved after the alignment between the deposition mask 1 and the substrate for vapor deposition 2, so that the deposition mask 1 can be sufficiently attracted to the substrate for vapor deposition 2 without causing the relative movement between the substrate for vapor deposition 2 and the deposition mask 1.

The time for attaching the substrate for vapor deposition 2 and aligning the deposition mask 1 relative to the substrate for vapor deposition 2 is about 10 seconds at the maximum and much shorter than a vapor deposition time of about 120 seconds. Consequently, Joule heat generated by the current flowing through the coil of the electromagnet 3B is very small, whereby a temperature increase of the substrate for vapor deposition 2 and the deposition mask 1 is significantly reduced. Also, when the substrate for vapor deposition 2 is detached after completion of the vapor deposition, this operation is preferably performed by driving the electromagnet 3B to weaken the magnetic field. This case does not need a delicate operation, such as the alignment, so that the detaching can be completed in a much shorter time, thus reducing the heat generation of the magnet chuck 3. In short, as the operation time of the electromagnet 3B as a heat generating source is very short, the influence of the thermal expansion on the deposition mask 1 or the like due to the heat generation of the electromagnet 3B can be suppressed as much as possible.

On the other hand, the vapor deposition apparatus continuously performs vapor deposition by sequentially replacing the substrate for vapor deposition 2. Thus, although the amount of generated heat is small, the heat might accumulate. However, during the operation of the relative alignment (so-called alignment) between the substrate for vapor deposition 2 and the deposition mask 1, the deposition mask 1 is hardly attracted by the magnet chuck 3, whereby the substrate for vapor deposition 2 and the deposition mask 1 are not in close contact therebetween and are slightly spaced apart from each other. Thus, even if the temperature of the substrate for vapor deposition 2 increases, the heat is not immediately transferred to the deposition mask 1 and not accumulated in the deposition mask 1. Furthermore, as the substrate for vapor deposition 2 is replaced after the vapor deposition, a cooled substrate for vapor deposition 2 is carried in the vapor deposition apparatus every time it is replaced, so that heat is less likely to be accumulated in the substrate for vapor deposition 2. In particular, if the substrate holder 29 for holding the substrate for vapor deposition 2 and the mask holder 15 for holding the deposition mask 1 are not in contact with each other and are thermally isolated, for example, by a heat insulating member or the like, the accumulation of heat in the deposition mask 1 is reduced. An example of this specific structure will be described later with reference to FIG. 7A. That is, in the present embodiment, unless heat from the substrate for vapor deposition 2 is directly transferred to the deposition mask 1 (i.e., if the deposition mask 1 is positioned with a slight gap from the substrate for vapor deposition 2), the deposition mask 1 hardly increases its temperature. As a result, by suppressing the thermal conduction between the substrate holder 29 and the mask holder 15, the vapor deposition apparatus is provided which is less likely to be influenced thermally, in other words, which can easily reduce the misalignment of the vapor deposition pattern due to the thermal expansion of the deposition mask 1.

On the other hand, when a sufficient attraction force is not obtained only by the magnetic force of the permanent magnet 3A, the orientation of the current can also be changed by a control circuit of a power supply circuit (not shown) such that after the alignment, the magnetic field of the electromagnet 3B has the same orientation as the orientation of the magnetic field of the permanent magnet 3A. In this case, as the electromagnet 3B is used just to assist the permanent magnet 3A, the current only needs to be one-tenth (1/10) or less of the current used when the necessary magnetic field is obtained only by the electromagnet 3B, and thus heat generation is reduced significantly. However, cooling of the magnet chuck 3 is preferably performed simultaneously when the temperature of the magnet chuck 3 increases due to generation of Joule heat at the time of mounting and alignment of the above-mentioned substrate for vapor deposition 2 or the like, accumulation of heat, and the like. The cooling structure of the magnet chuck 3 will be described later.

In an example shown in FIG. 2, the above-mentioned relationship of vertical overlap between the permanent magnet 3A and the electromagnet 3B shown in FIG. 2 is configured such that the permanent magnet 3A is provided to face the touch plate 4 (the substrate for vapor deposition 2), and the electromagnet 3B is provided on the surface of the permanent magnet 3A opposite to the substrate for vapor deposition 2. However, the vertical relationship is not limited to this example. It should be noted that as mentioned above, when heat generation might occur, cooling is necessary. When cooling is performed by the heat pipe 7 (see FIG. 3) described later, the vertical relationship shown in FIG. 2 is preferable.

In a case where the electromagnet 3B is used and the current is turned on and off, when the current rapidly increases or the current rapidly changes to 0, electromagnetic induction occurs, causing a current to flow through a closed circuit. For example, in a case where organic layers of an organic EL display apparatus are deposited, a closed circuit, such as a thin film transistor (TFT) for driving, is provided on a support substrate. After the organic layers and both electrodes are formed, the closed circuit is configured. If a current caused by the electromagnetic induction flows through the closed circuit, elements, such as the TFT and the organic layer, are destroyed. The occurrence of the electromagnetic induction is caused by a rapid change of the magnetic field. Thus, the rapid change of the magnetic field by the electromagnet must be avoided. From this point of view, the problem of electromagnetic induction can be solved by inserting a capacitor of, for example, about 5000 or more in parallel with the electromagnet 3B into a power supply circuit (not shown) of the electromagnet 3B, or by providing a plurality of terminals in the coil to gradually increase or decrease the turn number of the coil to which the current is applied, or by applying the current in a large rising time. However, since in the present embodiment, the magnetic field is applied by the electromagnet in an orientation to cancel the magnetic field generated by the permanent magnet 3A, the influence of this electromagnetic induction can also be considered to be small.

(Outline of Structure of Vapor Deposition Apparatus)

Figure 7A:
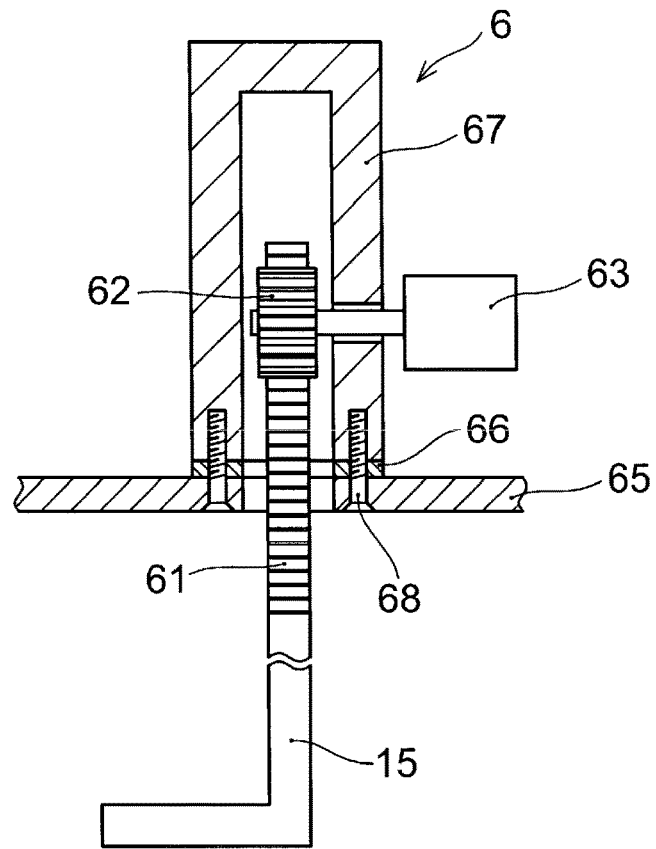

The vapor deposition apparatus according to an embodiment of the present invention is illustrated in a schematic view of FIG. 1. A mask holder 15 and a substrate holder 29 are provided to be movable vertically so that the deposition mask 1 and the substrate for vapor deposition 2 are disposed in proximity to each other inside a vacuum chamber 8 (see FIG. 3; however, the vacuum chamber 8 is omitted in FIGS. 1 and 2). The substrate holder 29 is connected to a driving device 6 so as to hold the peripheral edges of the substrate for vapor deposition 2 with a plurality of hook-shaped arms and to be capable of ascending and descending vertically, for example, as shown in FIG. 7A. When replacing the substrate for vapor deposition 2 or the like, the deposition target substrate 2 carried into the vacuum chamber 8 by robot arms is received by the hook-shaped arms, and the substrate holder 29 is lowered until the substrate for vapor deposition 2 is in proximity to the deposition mask 1. The mask holder 15 also has substantially the same configuration as the substrate holder 29. An imaging device (not shown) is also provided for performing alignment.

The driving device 6 can be formed in various configurations. However, in an example of the mask holder 15 shown in FIG. 7A, for example, a rack 61 is provided to the tip end part of the mask holder 15, and a pinion 62 is rotated by a motor 63 to be capable of vertically moving the mask holder 15. The driving device 6 may be formed by attaching a housing 67 to a support plate 65 mounted in the chamber 8 with screws 68. In the example shown in FIG. 7A, configured to block heat conduction between the above-mentioned mask holder 15 and the substrate holder 29, a spacer 66 (heat insulating member) formed of a heat insulating material is interposed between the housing 67 and the support plate 65. In this case, it is preferable that each screw 68 is not made of metal, but plastic or the like which is hard to transfer heat. Consequently, even when not only the mask holder 15 but also the substrate holder 29 is mounted on the same support plate 65 by means of the same structure, heat block is sufficiently achieved because the mask holder 15 and the substrate holder 29 are provided with a heat insulating member (spacer 66) interposed therebetween.

The touch plate 4 is supported by a support frame 41 and connected, via the support frame 41, to a driving device that lowers the touch plate 4 until the touch plate 4 contacts the substrate for vapor deposition 2. The touch plate 4 is lowered to planarize the substrate for vapor deposition 2, which is pressed by the touch plate 4 not to cause warp. Although not shown in the figure, the touch plate 4 may flow the cooling water therein. Further, a vapor deposition source 5 is provided on the position facing a surface of the deposition mask 1 opposite to the substrate for vapor deposition 2 and spaced apart from the deposition mask 1, and the vapor deposition material 51 is evaporated or sublimated.

The substrate for vapor deposition 2 and the deposition mask 1 are aligned with each other in a state where the touch plate 4 and the magnet chuck 3 are lowered to bring the touch plate 4 into contact with the substrate for vapor deposition 2. When the deposition mask 1 and the substrate for vapor deposition 2 are aligned with each other, relative movement between the substrate for vapor deposition 2 and the deposition mask 1 is performed while imaging alignment marks respectively formed on the deposition mask 1 and the substrate for vapor deposition 2. Thus, the vapor deposition apparatus also includes a fine movement device to finely move the substrate for vapor deposition 2 or the like. When performing this alignment, it is preferable that strong attraction by the magnet chuck 3 is not generated. In the present embodiment, as mentioned above, during the alignment, the electromagnet 3B is also driven while attracting the deposition mask by the permanent magnet 3A to weaken its attraction force. Thus, there is no possibility that the substrate for vapor deposition 2 and the deposition mask 1 are strongly in contact with each other and cannot be moved finely. Consequently, the precise positional adjustment can be easily performed in a short period of time. Further, after the completion of the positional adjustment, only by turning off the power supply of the electromagnet 3B, the deposition mask 1 is attracted toward the substrate for vapor deposition 2 by the strong attraction force of the permanent magnet 3A.

In the example shown in FIG. 1, the permanent magnets 3A and cores 31 and coils 32 of the electromagnets 3B are covered with the covering material 34. Consequently, a unit magnet (a pair of permanent magnet 3A and electromagnet 3B) is fixed, which facilitates handling of the installation. In addition, when cooling is performed by a heat pipe 7 (see FIG. 3) to be described later, the contact between the heat pipe 7 and the covering material 34 of the magnet chuck 3 can be easily obtained over a wider area. Furthermore, as heat generated in the coil 32 is also transferred easily from the periphery thereof to the covering material 34, the cooling effect can be easily improved. Moreover, as shown in FIG. 1, the deposition mask 1 has a structure in which a frame 14 attached to the periphery of the deposition mask 1 is held by the mask holder 15. Consequently, the deposition mask 1 is held without being deformed.

As mentioned above, each magnet chuck 3 includes the permanent magnet 3A and the electromagnet 3B. As the electromagnet 3B, various types of electromagnets can be used, such as one having a core 31, one having a yoke 33 (see FIG. 4), and one having the covering material 34 and the like. The outer shape of the core 31 may be a polygon, such as a quadrangle, or a circle. For example, when the size of the deposition mask 1 is about 1.5 m×1.8 m, an unit electromagnet 3B which is included in an unit magnet chuck 3 (a set of an unit permanent magnet 3A and the unit electromagnet 3B) shown in FIG. 2, has the core 31 with a cross section of about 5 cm square, and a plurality of unit magnet chucks can be arranged side by side according to the size of the deposition mask 1 as shown in FIG. 2 (the number of unit electromagnets is shown on a laterally reduced scale in FIG. 2 by reducing number of unit electro magnets. The ratio of the number of the permanent magnets 3A to that of the electromagnets 3B is not necessarily 1:1 and the number of electromagnets 3 may be smaller than that of the permanent magnets 3A). Although the examples shown in FIGS. 1 and 2 do not illustrate the connection between the coils of the electromagnets 3B, the coils 32 wound around the respective cores 31 may be connected in series or in parallel. In addition, several units of the electromagnets 3B may be connected in series. A current may be independently applied to a part of the unit electromagnet.

Figure 8:
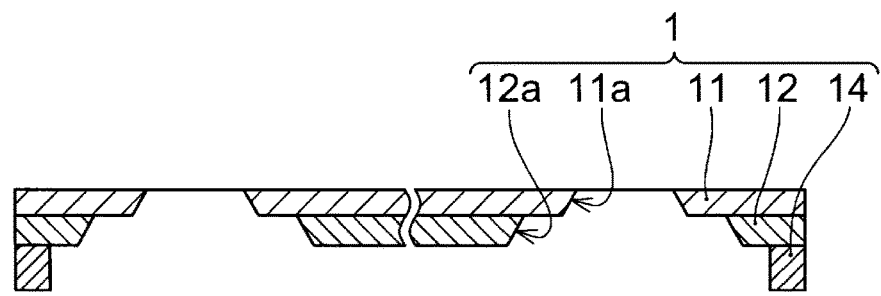
FIG. 8 is an enlarged view of an example of a deposition mask.

As shown in FIG. 8, the deposition mask 1 includes a resin layer 11, a metal support layer 12, and a frame (frame body) 14 attached around the resin layer and the metal support layer. As shown in FIG. 1, the deposition mask 1 is provided by placing the frame 14 on the mask holder 15. The metal support layer 12 is formed using magnetic material. Consequently, an attraction force acts between the permanent magnet 3A and the deposition mask 1, so that the deposition mask 1 is attracted to the permanent magnet 3A with the substrate for vapor deposition 2 interposed therebetween. It should be noted that the metal support layer 12 may be formed of a ferromagnetic material. In this case, the metal support layer 12 is magnetized by the strong magnetic field of the permanent magnet 3A (Note that to magnetize means to be in a state where the strong magnetization remains even after removing external magnetic field). The deposition mask 1 may be formed as one large panel like a large-sized television, or may be formed as one deposition mask obtained by combining a plurality of small panels like a smartphone.

For example, Fe, Co, Ni, Mn, or an alloy thereof can be used as the metal support layer 12. Among them, invar (an alloy of Fe and Ni) is particularly preferable because it has a small difference in the coefficient of linear expansion from the substrate for vapor deposition 2 and hardly expands due to heat. The metal support layer 12 is formed to have a thickness of about 5 μm to 30 μm.

It should be noted that in FIG. 8, an opening 11a of the resin layer 11 and an opening 12a of the metal support layer 12 are tapered to become smaller toward the substrate for vapor deposition 2 (see FIG. 1). The reason for this is to prevent the vaporized or sublimated vapor deposition material from being blocked when the vapor deposition material is deposited. It should be noted that various types of vapor deposition sources 5, such as a point-shaped, a linear-shaped, or a planer-shaped one, can be used as the vapor deposition source 5. For example, vapor deposition is performed over the entire surface of the substrate for vapor deposition 2 by scanning the entire substrate for vapor deposition, for example, from the left end of the paper surface to the right end thereof in the FIG. 1, using the vapor deposition source 5, called a line-source. In the line-source, crucibles are arranged linearly therein, over the entire length which has the same length as the width of the deposition mask 1 (the length in the direction perpendicular to the paper surface of FIG. 1). Therefore, the above-mentioned taper is formed so that the vapor deposition material vaporize or sublimate from various directions and that even the vapor deposition material coming from an oblique direction can reach the substrate for vapor deposition 2 without being blocked.

The example shown in FIG. 2 differs from the example shown in FIG. 1 only in the arrangement relationship between the permanent magnet 3A and the electromagnet 3B of the magnet chuck 3, but these examples are the same in the other configurations. In FIG. 2, the permanent magnet 3A and the electromagnet 3B are overlapped each other in the axial direction, and the configurations of other components are the same as those shown in FIG. 1. The same parts are denoted by the same reference numerals, and the description thereof will be omitted. Even if the permanent magnet 3A and the electromagnet 3B are arranged vertically in this manner, the magnetic field of the permanent magnet 3A as a whole is offset and weakened by the magnetic field of the electromagnet 3B. This structure is preferable because many permanent magnets 3A can be arranged. However, also in this case, the repulsive force acts between the permanent magnet 3A and the electromagnet 3B in the same manner as the magnetic plate 35 is attached as shown in FIG. 1. Because of this, it is necessary to firmly fix both the permanent magnet 3A and the electromagnet 3B. From this viewpoint, as mentioned above, an electromagnet is preferably formed around the permanent magnet 3A.

As mentioned above, the number of permanent magnets 3A does not need to be the same as the number of electromagnets 3B, and absolute values of the magnetic fields in the reverse orientation generated by the permanent magnet 3A and the electromagnet 3B may not be the same with each other. In short, if the magnetic field of the permanent magnet 3A is weakened to some extent, the influence of the magnetic field on alignment or the like can be avoided. When the number of electromagnets 3B is small and the magnetic field to be used for cancellation is too small, the current can be increased to adjust the magnetic field of the electromagnets 3B. Further, although in the example shown in FIG. 1, the permanent magnets 3A and the electromagnets 3B are arranged side by side, for example, the electromagnet 3B can be arranged in the vicinity of an intersection point of the diagonal lines of the four permanent magnets 3A by shifting the electromagnet 3B by half a pitch.

Figure 3:
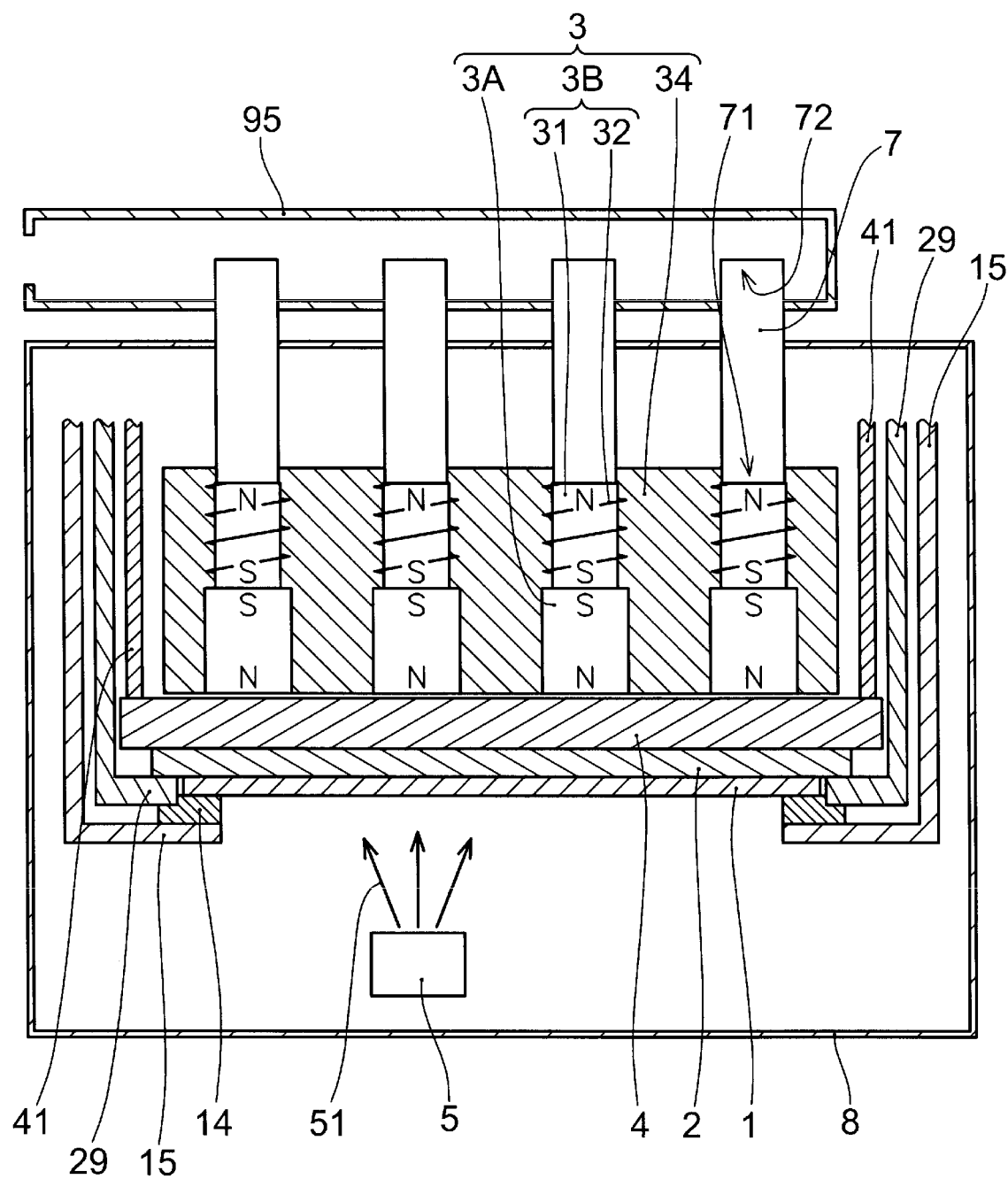
FIG. 3 is a schematic diagram of a vapor deposition apparatus according to still another example of the vapor deposition apparatus shown in FIG. 1.
Figure 4:
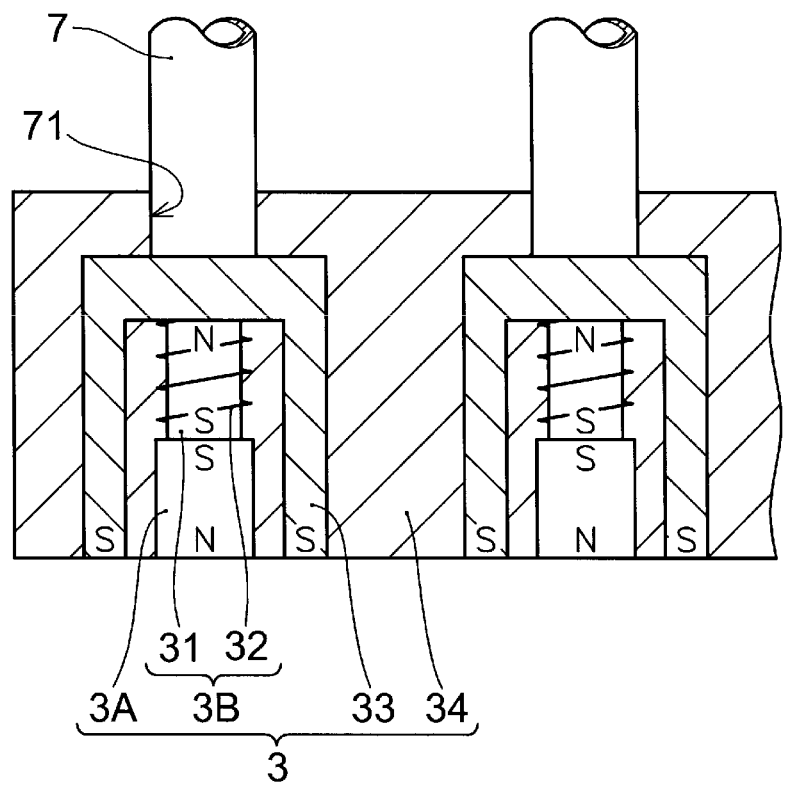
FIG. 4 is a schematic diagram of part of a magnet chuck according to a further example of the vapor deposition apparatus shown in FIG. 2.

FIGS. 3 and 4 show an example in which a cooling structure is formed on the magnet chuck 3. That is, the present embodiment is characterized in that cooling means for cooling the magnet chuck 3 is provided, and hence this cooling structure will be described below. Hereinafter, a description of other components will be omitted. As mentioned above, in the present embodiment, although the electromagnet 3B is included, it is operated for a very short period of time. Thus, the problem of heat generation is suppressed effectively. As mentioned above, if the substrate holder 29 and the mask holder 15 are thermally insulated from each other, the substrates for vapor deposition 2 are replaced one after another, so that thermal accumulation is unlikely to occur. However, when the temperature of the substrate for vapor deposition 2 rises at the time of the alignment, the substrate for vapor deposition 2 and the deposition mask 1 are in close contact with each other at the time of the subsequent vapor deposition, so that there is a possibility of thermal conduction to the deposition mask 1. Even when vapor deposition is continuously performed by replacing the substrate for vapor deposition 2, the operation of the electromagnet 3 for a next substrate for vapor deposition 2 may be performed before a little heat transferred to the deposition mask 1 is released to completely cool down the deposition mask 1. Consequently, the similar thermal conduction could occur to the deposition mask 1. When the magnetic force of the permanent magnet 3A is weak, the lack of the magnetic force may be compensated for by the magnetic field of the electromagnet 3B as mentioned above. In such a case, the current through the electromagnet 3B may be small, but must flow therethrough during the entire vapor deposition time.

Meanwhile, when the temperature of the electromagnet 3B rises, the temperature of the substrate for vapor deposition 2 or the deposition mask 1 arranged near the electromagnet 3B rises due to the thermal conduction. Both the substrate for vapor deposition 2 and the deposition mask 1 are formed of different materials and have different coefficients of thermal expansion (coefficients of liner expansion). Because of this, when the temperature of the substrate for vapor deposition 2 or the deposition mask 1 rises, there could occur the misalignment between an opening pattern of the deposition mask 1 and the position of the substrate for vapor deposition 2 to be deposited. As such, the vapor deposition of the accurate pattern is interrupted, and pixels are blurred, thus failing to obtain the high-definition display panel. For this reason, a temperature increase of the magnet chuck 3 must be avoided as much as possible. In this case, since the inside of the vacuum chamber 8 is a vacuum atmosphere, the effective heat dissipation of the magnet chuck 3 is difficult to perform. However, as a result of extensive studies, the present inventors have found that heat dissipation can be performed very efficiently even for a slight temperature increase by dissipating heat using the heat pipe 7 (see FIG. 5). In such a case, by bringing the heat pipe 7 into contact with the magnet chuck 3 at an area as large as possible, i.e., at least an area equal to or larger than the cross-sectional area within the inner perimeter of the coil 32 of the electromagnet 3B, the efficiency of heat dissipation is improved.

(Cooling Structure of Magnet Chuck)

Figure 5:
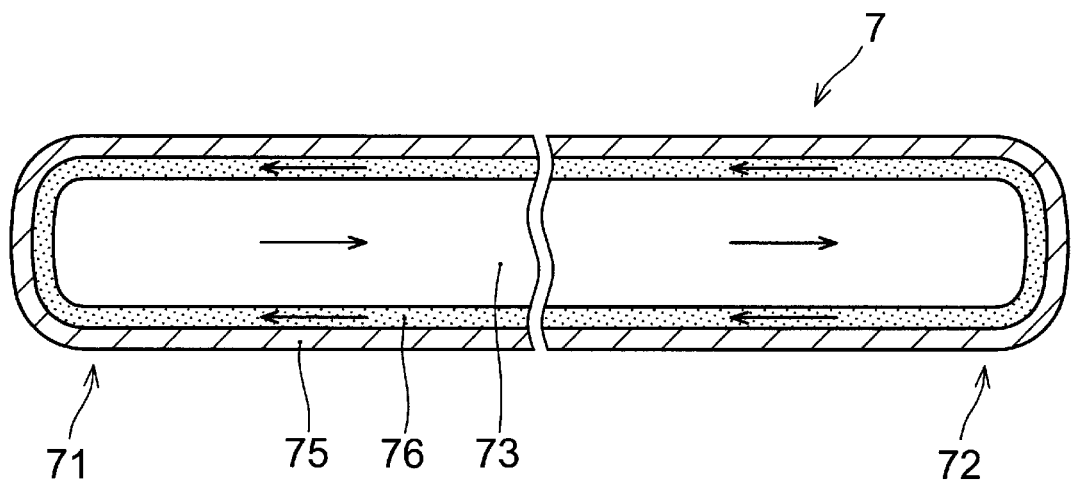
FIG. 5 is a diagram explaining a structural example of a heat pipe shown in FIGS. 3 and 4.

As a typical example, the heat pipe 7 has a structure as shown in FIG. 5. That is, a wick 76 for moving a liquid by capillary action is formed on an inner wall of a vacuum-sealed pipe (case; container) 75 made of, for example, copper or the like, whereby a vacuum (low-pressure) structure is formed in which a small amount of an operating fluid (not shown) made of water or the like is sealed in the pipe 75. In this structure, when the heat absorption part 71, which is one end part, is heated by ambient heat, an operating fluid evaporates to generate vapor, thus increasing the internal pressure of the pipe 75. The vapor passes through a space 73 and is condensed and liquefied in the heat dissipation part (cooling part) 72, which is the other end part. The liquefied working fluid travels toward the heat absorption part 71 by the capillary action in the wick 76 formed on the inner wall of the pipe 75. Owing to the latent thermal conduction that accompanies such evaporation and the condensation, a large amount of heat is transported from the heat absorption part 71 to the heat dissipation part 72 even at a small temperature difference. The thermal conduction efficiency of the heat pipe 7 is said to reach even 100 times the thermal conduction efficiency of a round copper rod. The wick 76 may have a structure, such as a wire mesh, a porous body, a sponge, or the like, as long as the liquid travels through the structure due to the capillary action.

As mentioned above, when the heat pipe 7 is disposed laterally, the condensed liquid is conveyed to the heat absorption part 71 through the wick 76. However, for example, when the heat pipe 7 is arranged in the longitudinal direction (vertical direction), and on its lower side, the heat absorption part 71 is positioned (that is, a part of the heat pipe 7 having a high temperature is disposed on the lower position of the heat pipe 7), the liquid is evaporated on the lower position to form vapor, and the vapor rises and is condensed in the heat dissipation part 72. In this case, even without the wick 76, the liquefied liquid falls under by its own weight and returns to the heat absorption part 71. This is called a thermosiphon type. In the present embodiment, either type of heat pipe 7 can be used. For example, the wick 76 may be present when the heat pipe 7 is arranged in the longitudinal direction.

Such a heat pipe 7 is not limited to the rod shape as shown in FIG. 5, but may be formed, for example, in a flat shape (plate shape). When the heat pipe is formed in the flat shape, then it can be rolled and embedded in the core 31 of the electromagnet 3B. In this way, the magnetic field lines within the core 31 are hardly affected by the heat pipe. Moreover, for example, as shown in Thermal Science & Engineering, pages 41-56, Vol. 2, No. 3 (2015) to be described later, a loop-type heat pipe structure can have a plate-shaped heat absorption part provided over the entire front surface (surface facing the substrate for vapor deposition 2) of the above-mentioned magnet chuck 3. An example in which the simple rod-shaped heat pipe 7 is joined with the magnet chuck 3 is shown in FIGS. 3 and 4 mentioned above.

In the example shown in FIG. 3, the permanent magnet 3A and the electromagnet 3B are arranged in the axial direction with the entire peripheries thereof covered with the covering material 34, which is the same structure as the vapor deposition apparatus shown in FIG. 2. In addition, in the example of FIG. 3, the heat pipe 7 is provided in contact with the upper surface of the core 31 of the electromagnet 3B. The cross-sectional area of the bottom surface of the heat pipe 7 is substantially the same as that within the inner perimeter of the coil 32 of the electromagnet 3B, but the heat absorption part 71 of the heat pipe 7 is embedded in the covering material 34. Thus, in addition to the contact area between the core 31 and the heat pipe 7, an area of the side surface of the heat pipe 7 embedded in the inside of the covering material 34 also serves as the contact area. The heat dissipation part 72, which is an end part of the heat pipe 7 opposite to the heat absorption part 71, is guided out to the outside of the vacuum chamber 8, put into an exhaust heat tank 95, and is air-cooled, water-cooled, or the like.

Figure 7B:
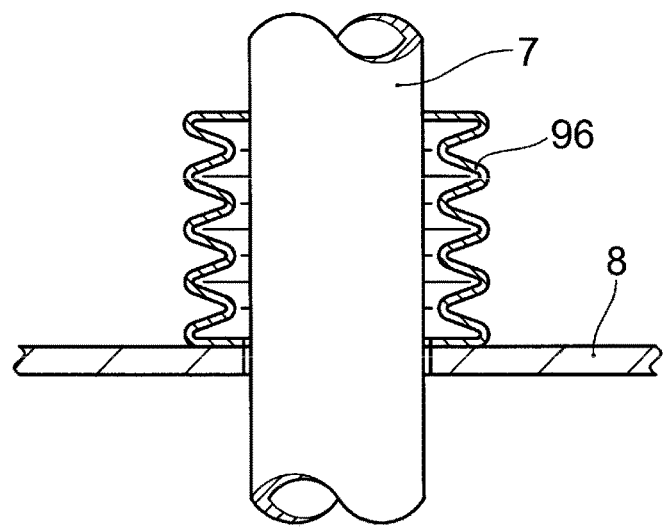
FIG. 7B is a diagram showing an example of a structure in which a heat pipe is connected to a vacuum chamber.

When replacing the substrate for vapor deposition 2 or the deposition mask 1, the magnet chuck 3 and the touch plate 4 also need to be lifted upward. And the magnet chuck 3 and the touch plate 4 also need to be lowered again after the replacement. For this reason, the heat pipe 7 cannot be directly fixed to a wall surface of the vacuum chamber 8 by airtight sealing. In such a case, as shown in FIG. 7B, the heat pipe 7 is preferably fixed to the vacuum chamber 8 via a bellows 96. The distance by which the magnet chucks 3 and the like are lifted when replacing the substrates for vapor deposition 2 or the like is about 100 mm or less. Hence, any bellows 96 that is capable of expanding and contracting to such an extent may be used.

However, while the magnet chuck 3 and the touch plate 4 have fixed structures, the deposition mask 1 and the substrate for vapor deposition 2 may be lowered so as to replace the substrate for vapor deposition 2 and the like, and then lifted to and disposed at a predetermined position. With such a structure, the heat pipe 7 can be directly bonded and sealed to the vacuum chamber 8 without using the bellows 96. In the case of using the bellows 96 described above, if the bellows 96 is broken, the interior of the vacuum chamber 8 is exposed to the atmosphere, causing contamination of the inner wall. When the inner wall of the vacuum chamber 8 is contaminated, the inner wall needs to be cleaned because the vacuum chamber 8 acts as a gas source. Owing to this, the bellows 96 preferably has a double structure. For example, the structure shown in FIG. 3 is preferably configured to cover the heat pipe 7 between the outer wall of the exhaust heat tank 95 and the outer wall of the vacuum chamber 8 with a coating cover (not shown) so as to include the bellows 96 (see FIG. 7B).

The structure shown in FIG. 4 is a modified example of the example shown in FIG. 3. In this example, the C-type yoke (E-type yoke formed with the permanent magnet 3A and the core 31 of the electromagnet 3B) 33 is connected to one end part of the unit magnet which the permanent magnet 3A and the electromagnet 3B are connected each other in the axial direction. The end surfaces of the yoke 33 are disposed to be substantially flat with a first end surface (a surface facing the substrate for vapor deposition 2) which is a surface of the permanent magnet 3A opposite to the electromagnet. With such a structure, the magnetic field lines of the permanent magnet 3A are guided from the S pole of the surface opposite to the first end surface of the permanent magnet 3A, in the example shown in the figure to the end surfaces of each yoke 33, via the core 31 of the electromagnet 3B having a small magnetic resistance and the yoke 33. Consequently, strong magnetic field lines are formed between the first end surface of the permanent magnet 3A and the end surfaces of the yoke 33, so that a strong magnetic field can also be applied to the deposition mask 1 provided in the vicinity of the first surface of the permanent magnet and the end surfaces of the yoke 33. In this case, the yoke 33 also becomes a part of the magnet chuck 3. The yoke 33 is formed using a magnetic material, such as iron, similar to that of the core 31.

According to the example shown in FIG. 4, when the magnet chucks 3 are cooled by the heat pipes 7 as in the above-mentioned example, the contact area between the heat pipes 7 and the magnet chucks 3 can be increased. That is, the width of the yoke 33 can be made larger than the width (diameter) of the core 31. Thus, the contact area between the heat pipe 7 and the magnet chuck 3 can be increased. By increasing the contact area, the heat of the magnet chuck 3 can be further released through the heat pipes 7. As shown in FIG. 4, the heat generated in the coils 32 can be more effectively transferred to the covering material 34 by covering the magnet chuck 3 including the yoke 33 with the above-mentioned covering material 34, and the contact area between the heat pipe 7 and the magnet chuck 3 can be further increased by embedding the heat pipes 7 in the covering material 34. As a result, the heat of the magnet chuck 3 can be effectively released.

Regarding the yoke 33, the yoke 33 is not limited to a structure in which the electromagnet 3B is provided on the permanent magnet 3A and the yoke 33 is provided thereon. The electromagnet 3B may be provided to face the touch plate 4 (substrate for vapor deposition 2), the permanent magnet 3A may be disposed thereon, and the yoke 33 may be provided thereon. However, as described above, if the heat pipe 7 is provided, the arrangement shown in FIG. 4 is preferable. This is because the purpose is to release the generated heat which is generated by the electromagnet 3B.

Each of the above-mentioned examples has the structure in which the entire magnet chuck 3 is covered with the covering material 34. This structure has advantages that handling is easy because the magnet chuck 3 is covered with the covering material 34, and that the coil can be easily dissipate heat when the magnet chuck 3 is cooled by the heat pipe 7. However, the coating material 34 may not be provided. When the magnet chuck is cooled by the heat pipe 7, the contact area between the heat pipe 7 and the magnet chuck 3 can be increased by widening the yoke 33 even if the covering material 34 is not provided, as described above. Further, by embedding a part of the heat pipe 7 in the yoke 33 or the core 31, the contact area therebetween can be increased.

Figure 6A:
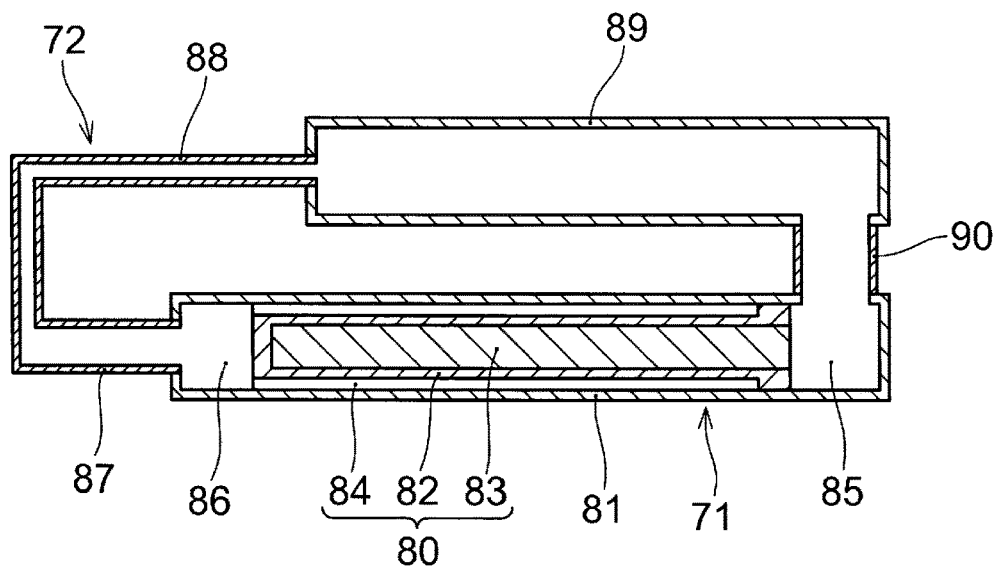
FIG. 6A is an explanatory diagram of a heat pipe for explaining a still further example of a joint between the electromagnet and the heat pipe.
Figure 6B:
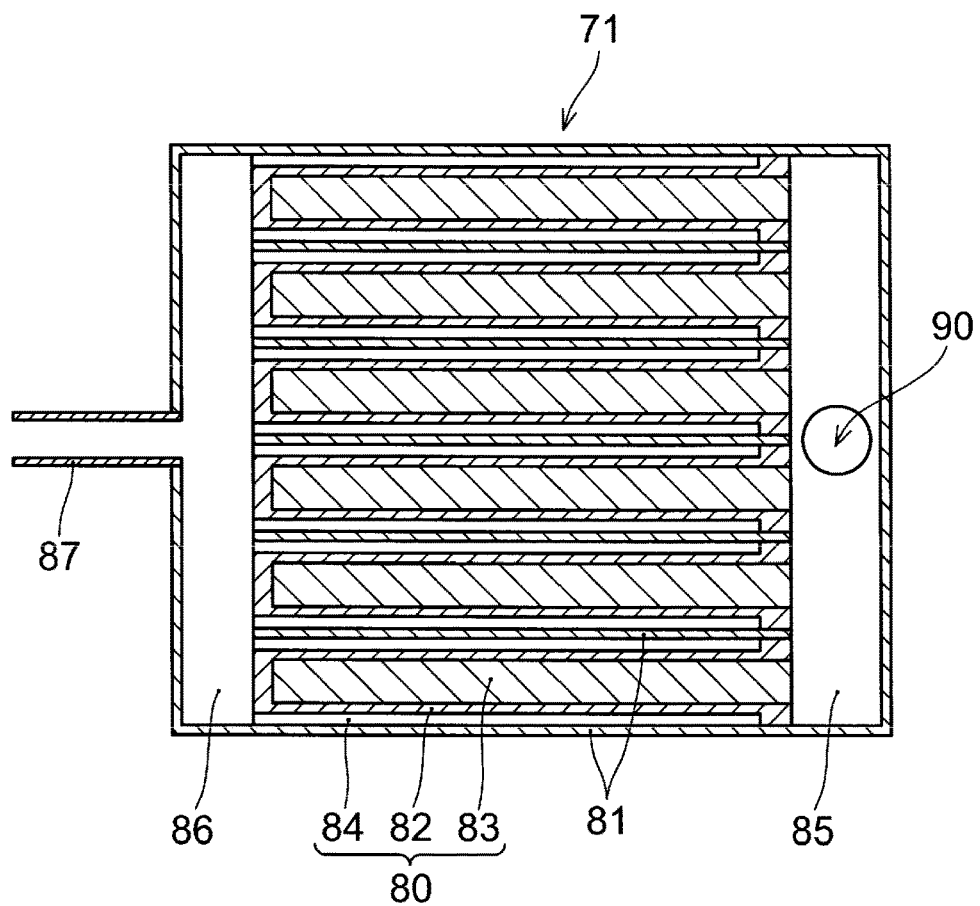
FIG. 6B is a plan view of a heat absorption part shown in FIG. 6A.
Figure 6C:
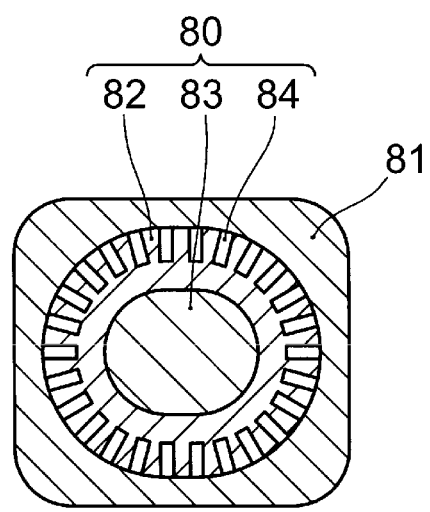
FIG. 6C is an explanatory diagram of a wick structure shown in FIG. 6B.

FIGS. 6A to 6D show other example of the cooling structure, in which the heat pipe 7 has the same structure as the loop-type heat pipe described in Thermal Science & Engineering, pages 41-56, Vol. 2, No. 3 (2015), mentioned above. FIGS. 6A to 6C show a side view of the loop-type heat pipe 7, an explanatory plan view of the heat absorption part, and a structural example of the wick, respectively. That is, as shown in an explanatory plan view of the heat absorption part 71 in FIG. 6B, a plurality of wick structure bodies 80 (six in the example shown in FIG. 6B) are embedded in a case 81 made of copper or the like. Each wick structure body 80 has a wick core 83 at its center part, as shown in FIG. 6C by the cross-sectional structure, a wick 82 is formed in a cogwheel-like shape (gear-like shape) around the wick core, and grooves 84 are formed between respective blades (teeth) of the cogwheel-like shaped (gear-like shaped) wick 82 to provide a path for vapor.

The wick structure body 80 can be formed to have the size of, for example, about 8 mm×9 mm, (the thickness of the heat absorption part 71 can be reduced by crushing it in the height direction into an oval shape). In this case, the groove 84 can be formed to have a depth of 1 mm and a width of about 0.5 mm. The wick 82 and the wick core 83 are made of, for example, a porous material, such as PTFE (polytetrafluoroethylene). Pores in this porous material can be formed with an average radius of about 5 µm and a porosity of about 35%. Such a wick 82 is formed integrally with the grooves 84, for example, by molding powdery PTFE.

In FIGS. 6A and 6B, reference numeral 86 denotes a vapor collecting portion, 87 denotes a vapor pipe, 88 denotes a liquid pipe, 89 denotes a liquid reservoir tank, 90 denotes a connection pipe, and 85 denotes a liquid distributing portion. The basic operation of this device is the same as the operation of the heat pipe shown in FIG. 5 described above, but in this device, liquid is sucked by the capillary action of each wick core 83 in the liquid distributing portion 85 to proceed from the wick core 83 to the capillary of the wick 82, and is evaporated by the heat from the case 81. The evaporated vapor proceeds to a vapor collecting portion 86 through spaces defined by the grooves 84. It should be noted that as shown in FIG. 6A, the grooves 84 are sealed by the wick 82 between the grooves 84 and the liquid distributing portion 85, while the groove 84 penetrates the vapor collecting portion 86. Thus, when the pressure in the groove 84 increases due to evaporation of the liquid, the vapor advances toward the vapor collecting portion 86. Then, the vapor is cooled in the heat dissipation part 72 through the vapor pipe 87 to be liquefied, and the resulting liquid is accumulated in the liquid reservoir tank 89 through the liquid pipe 88. The liquid stored in the liquid reservoir tank 89 returns to the liquid distributing portion 85 via the connection pipe 90 by gravity. As the vapor is liquefied in the heat dissipation part 72, the pressure in the case 81 decreases, and the liquid further evaporates in the heat absorption part (evaporating part) 71. The above-mentioned processes are repeated. The heat absorption part (evaporating part) 71 is formed to have such a structure, thereby making it possible to cool the wide area.

Figure 6D:
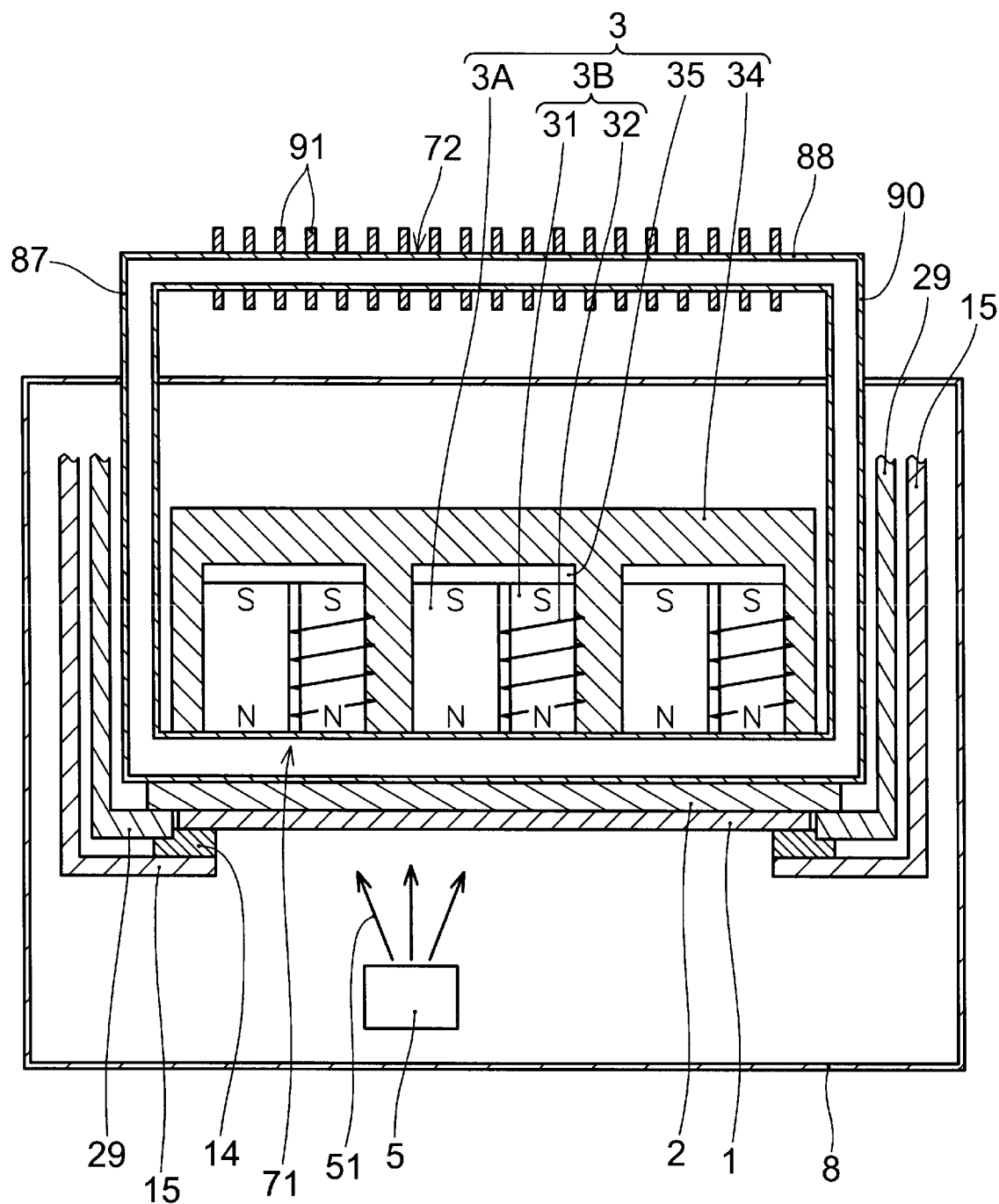
FIG. 6D is an schematic diagram showing a state in which a heat pipe shown in FIG. 6A is incorporated in the vapor deposition apparatus.

By using such a loop-type heat pipe 7, for example, as shown in FIG. 6D, the heat pipe 7 can be installed at the front surface (surface facing the deposition mask 1) of the magnet chucks 3 as it is. In the example shown in FIG. 6D, the heat absorption part 71 of the heat pipe 7 is provided in place of the touch plate 4 of the vapor deposition apparatus shown in FIG. 1. However, the conventional touch plate 4 may be provided as it is, and the loop-type heat pipe may be inserted between the touch plate 4 and the magnet chucks 3. With such a structure, the surfaces of the magnet chucks 3 facing the deposition mask 1 are cooled, which is the most appropriate for reducing the temperature increase of the deposition mask 1. In FIG. 6D, the same parts as those in FIG. 1 are denoted by the same reference numerals, and a description thereof will be omitted. Reference numeral 91 denotes a heat dissipation plate. That is, the heat dissipation part 72 can be cooled by air cooling or the like.

(Vapor Deposition Method)

Next, a vapor deposition method according to a second embodiment of the present invention will be described. As shown in FIG. 1 described above, the vapor deposition method in the second embodiment of the present invention comprises: a step of overlaying the deposition mask 1 including a magnetic material, the substrate for vapor deposition 2, and the magnet chucks 3 for attracting the deposition mask 1, and disposing the substrate for vapor deposition 2 and the deposition mask 1 in proximity to each other by the attraction of the deposition mask 1 using the magnet chuck 3; and a step of depositing the vapor deposition material 51 on the substrate for vapor deposition 2 by vaporizing or sublimating the vapor deposition material 51 from the vapor deposition source 5 spaced apart from the deposition mask 1, wherein the magnet chuck 3 includes the permanent magnet 3A and the electromagnet 3B, when the substrate for vapor deposition 2 and the deposition mask 1 are aligned with each other, the alignment is performed while applying a magnetic field in a reverse orientation relative to the orientation of the magnetic field of the permanent magnet 3A by using the electromagnet 3B so as to weaken the magnetic field of the permanent magnet 3A, and after the alignment, the deposition mask 1 is attracted by the permanent magnet 3A by turning off the magnetic field of the electromagnet 3B.

Figure 9:
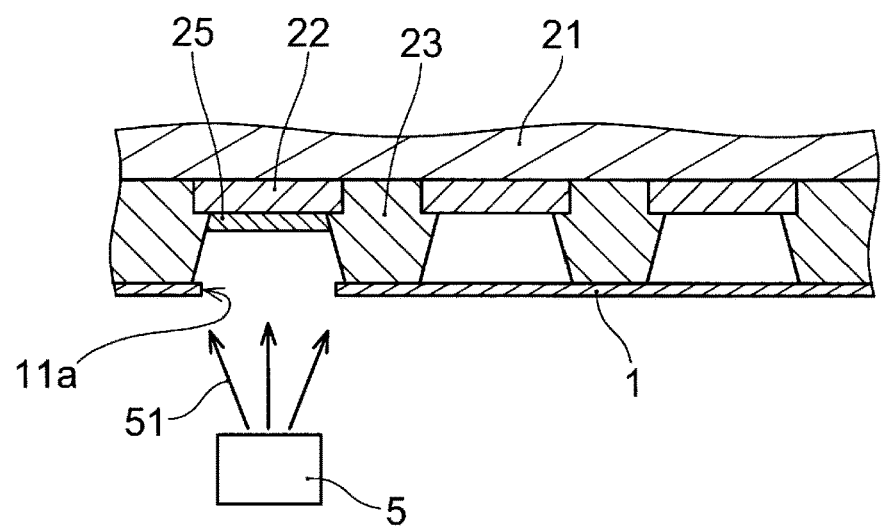
FIG. 9 is a diagram showing a vapor deposition process in the method of manufacturing an organic EL display apparatus according to the present embodiment.

As mentioned above, the substrate for vapor deposition 2 is overlaid on the deposition mask 1. The overlapping is performed by holding the deposition mask 1 and the substrate for vapor deposition 2, carried in by robot arms (not shown) by means of a mask holder 15 and a substrate holder 29, respectively, and then lowering the mask holder 15 and the substrate holder 29 to respective predetermined positions. The alignment between the substrate for vapor deposition 2 and the deposition mask 1 is performed as follows. The alignment may be performed by moving the substrate for vapor deposition 2 relative to the deposition mask 1 while observing alignment marks respectively formed on the deposition mask 1 and the substrate for vapor deposition 2 by means of the imaging device (not shown). At this time, as mentioned above, the alignment can be performed in a state where the force attracting the deposition mask 1 is weakened by operating the electromagnets 3B. According to this method, the opening 11a (see FIG. 8) of the deposition mask 1 can be aligned with a corresponding vapor deposition position on the substrate for vapor deposition 2 (for example, a pattern of a first electrode 22 on a support substrate 21 as shown in FIG. 9, in the case of an organic EL display apparatus to be described later). After the alignment, the operation of the electromagnets 3 is turned off. Consequently, the strong attractive force acts between the permanent magnet 3A and the deposition mask 1, thereby surely bringing the substrate for vapor deposition 2 and the deposition mask 1 close to each other. At this time, heat is hardly generated from the coil 32 because the time for allowing the current to flow through the coil 32 of the electromagnet 3B is spent almost for the alignment and is about 10 seconds at the maximum. When vapor deposition is continuously performed by replacement with the substrate for vapor deposition 2, leading to accumulation of heat, the cooling by using the heat pipe 7 (see FIG. 3) is preferably performed as mentioned above. As a result, the temperature increase of the deposition mask 1 is reduced.

Thereafter, as shown in FIG. 1, the vapor deposition material 51 is deposited on the substrate for vapor deposition 2 by vaporizing or sublimating the vapor deposition material 51 from the vapor deposition source 5 which is spaced apart from the deposition mask 1. Specifically, as mentioned above, line source formed by arranging crucibles linearly, are used, but the present invention is not limited thereto. For example, in the case of manufacturing an organic EL display apparatus, a plurality of types of deposition masks 1, each having openings 11a formed for some pixels, is prepared. Then, a vapor deposition process is repeatedly performed a multiple number of times by replacing one deposition mask 1 with another to thereby form organic layers. In this case, it is efficient to prepare a plurality of vapor deposition chambers 8 (see FIG. 3), to install different deposition masks 1 in the respective vapor deposition chambers 8, and to continuously performing vapor deposition while sequentially transferring the substrates for vapor deposition 2 to the different vapor deposition chambers 8.

According to this vapor deposition method, the magnet chuck 3 includes the permanent magnet 3A and the electromagnet 3B, and the magnetic field of the permanent magnet 3A is weakened when detaching the substrate for vapor deposition 2, or when aligning the substrate for vapor deposition 2 and the deposition mask 1. This makes these works easier. On the other hand, after the alignment, since the electromagnet 3B is turned off, the deposition mask 1 is attracted by the magnetic force of the permanent magnet 3A. Thus, the deposition mask 1 is strongly attracted to and brought into close contact with the substrate for vapor deposition 2. Thus, the same pattern as the deposition mask 1 can be deposited. In addition, during the vapor deposition, the electromagnet 3B is turned off, and the attraction performed by using the permanent magnet 3A does not generate heat at all, resulting in no increase of temperature at the magnet chuck 3 during the vapor deposition. That is, this configuration can solve the drawbacks caused when singly using the permanent magnet 3A or when singly using the electromagnet 3B as the magnet chuck 3, so that the vapor deposition is performed in the accurate pattern.

(Method of Manufacturing Organic EL Display Apparatus)

Next, a method of manufacturing an organic EL display apparatus using the vapor deposition method of the above embodiment will be described. Any processes in the manufacturing method other than the vapor deposition method can be performed by the well-known methods. Thus, a method of organic deposition layers by the vapor deposition method of the present embodiment will be mainly described with reference to FIGS. 9 and 10.

The method of manufacturing an organic EL display apparatus according to a third embodiment of the present invention includes: forming a TFT (not shown), a planarizing layer, and a first electrode (for example, an anode) 22 on the support substrate 21; aligning and overlaying the deposition mask 1 on one surface thereof; and forming an organic deposition layer 25 of organic layers by using the above-mentioned vapor deposition method to deposit the vapor deposition material 51. A second electrode 26 (see FIG. 10; a cathode) is formed on the organic deposition layer 25.

Figure 10:
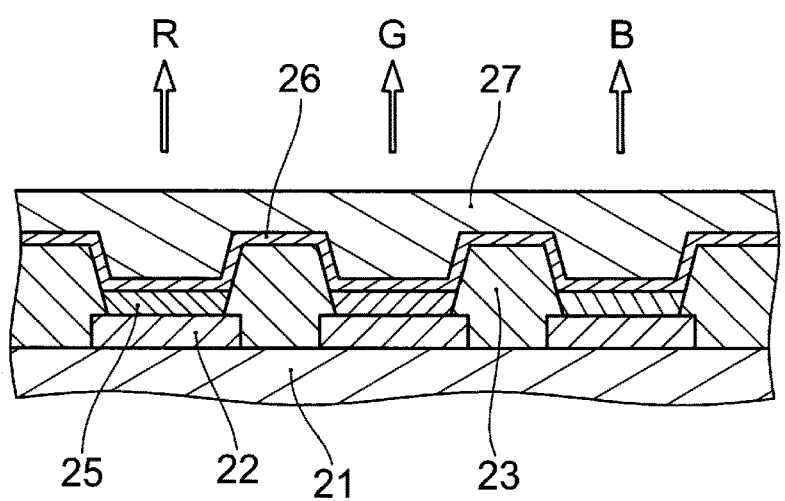
FIG. 10 is a diagram showing a state in which organic layers are deposited in the method of manufacturing the organic EL display apparatus of the present embodiment.

For example, although not shown completely, a driving element, such as a TFT, is formed on the support substrate 21, such as a glass plate, for each of RGB sub-pixels in each pixel, and the first electrode 22 connected to the driving element is formed, on the planarizing layer, by a combination of a metal layer made of Ag, APC, etc., and an ITO layer. As shown in FIGS. 9 and 10, insulating banks 23 made of $SiO_2$, an acrylic resin, a polyimide resin, or the like are formed between the sub-pixels to isolate the sub-pixels from each other. The above-mentioned deposition mask 1 is aligned with and fixed on such insulating banks 23 on the support substrate 21. As shown in FIG. 1 described above, the fixing is performed, for example, by using the permanent magnets 3A of the magnet chucks 3, which are provided via the touch plate 4 over the surface opposite to the vapor deposition surface of the support substrate 21 (substrate for vapor deposition 2), to attract the deposition mask 1. As mentioned above, since the magnetic material is used for the metal support layer 12 of the deposition mask 1 (see FIG. 8), when the magnetic field is generated by the magnet chuck 3, an attraction force is also generated between the metal support layer 12 of the deposition mask 1 and the magnet chuck 3. At this time, as mentioned above, the time during which the current flows through the coil 32 of the electromagnet 3B is short, and hence heat is hardly generated. However, by providing the heat pipe 7, even slight heat, it can be dissipated efficiently. As a result, even if there is a difference in the coefficient of thermal expansion between the deposition mask 1 and the support substrate 21, the relative misalignment therebetween is significantly suppressed. In addition, the high-definition organic EL display apparatus can be obtained.

In this state, as shown in FIG. 9, the vapor deposition material 51 is vaporized or sublimated from the vapor deposition source (crucible) 5 in the vapor deposition apparatus, and then the vapor deposition material 51 is deposited only on parts of the support substrate 21 exposed from the openings 11a of the deposition mask 1, so that the organic deposition layer 25 of the organic layers is formed on the first electrode 22 in each of desired sub-pixels. This vapor deposition step may be performed on each sub-pixel by sequentially replacing one deposition mask 1 with another. A deposition mask 1 which is formed so that the same material is simultaneously deposited on a plurality of sub-pixels may be used. When replacing the deposition mask 1, the operation of the electromagnet 3B (see FIG. 1), not shown in FIG. 9, is controlled by a power supply circuit (not shown) to weaken the magnetic field applied on the metal support layer 12 (see FIG. 8) of the deposition mask 1.

FIGS. 9 and 10 simply show so that the organic deposition layer 25 of the organic layers is formed of a single layer, but the organic deposition layer 25 of the organic layers may be formed of the organic deposition layer 25 of a plurality of layers made of different materials. For example, as a layer in contact with the anode 22, a hole injection layer made of a material to match it well in ionization energy to improve hole injection properties may be provided. A hole transport layer is formed on the hole injection layer using , for example, an amine-based material. The hole transport layer improves stable transportability of holes and enables electrons confinement (energy barrier) into a light emitting layer. Further, the light emitting layer, which is selected depending on a target emission wavelength, is formed on the hole transport layer, for example, by doping red or green organic phosphor material into $Alq_3$, for the red or green wavelength. As a blue-based material, a bis(styryl)amine (DSA)-based organic material is used. An electron transport layer is formed of $Alq_3$ or the like on the light emitting layer. The electron transport layer improves an electron injection property and stably transports electrons. These respective layers, each having a thickness of about several tens of nm, are deposited to form the organic deposition layer 25 of the organic layers. It should be noted that an electron injection layer, such as LiF or Liq, which improves the electron injection property, may also be provided between the organic layers and the metal electrode. In the present embodiment, these layers are included in the organic deposition layer 25 of the organic layers.

In the organic deposition layer 25 of the organic layers, an organic layer of a material corresponding to each color of RGB is deposited as the light emitting layer. In addition, the hole transport layer, the electron transport layer, and the like are preferably deposited separately by using materials suitable for the light emitting layer, if light emission performance is emphasized. However, in consideration of the material cost, the same material common to two or three colors of RGB is deposited in some cases. In a case where the material common to sub-pixels of two or more colors is deposited, the deposition mask 1 is formed to have openings 11a formed in the sub-pixels sharing the common material. In a case where individual sub-pixels have different deposited layers, for example, one deposition mask 1 is used for sub-pixels of R, so that the respective organic layers can be sequentially deposited. In a case where an organic layer common to RGB is deposited, other organic layers for the respective sub-pixels are deposited up to the lower side of the common layer, and then at the stage of the common organic layer, the common organic layer is deposited across the entire pixels at one time using the deposition mask 1 with the openings 11a formed in RGB sites. In the case of mass production, a number of vacuum chambers 8 of the vapor deposition apparatuses may be arranged side by side, different deposition masks 1 may be mounted in the respective vacuum chambers 8, and the support substrate 21 (substrate for vapor deposition 2) may be moved to each vapor deposition apparatus to continuously perform vapor deposition.

After finishing the formation of the organic deposition layer 25 of all the organic layers including the electron injection layer, such as a LiF layer, the electromagnets 3B are turned on to weaken the magnetic field as described above. In this situation, the deposition mask 1 and the support substrate 21 are separated from each other. Thereafter, a second electrode (e.g., a cathode) 26 is formed over the entire surface. An example shown in FIG. 10 is a system of a top emission type device, in which light is emitted from a surface opposite to the support substrate 21 shown in the figure. Thus, the second electrode 26 is formed of a light-transmissive material, for example, a thin Mg-Ag eutectic layer. In addition, Al or the like can be used. It should be noted that in a bottom emission type which emits light through the support substrate 21, ITO, $In_3O_4$, or the like can be used for the first electrode 22, and metals having low work functions, for example, Mg, K, Li, Al, or the like, can be used for the second electrode 26. A protective layer 27 made of, for example, $Si_3N_4$ or the like, is formed on the surface of the second electrode 26. It should be noted that the whole laminated body is sealed by a sealing layer made of glass, a moisture-resistant resin film, or the like (not shown), and is thus configured to prevent the organic deposition layer 25 of the organic layers from absorbing moisture. Alternatively, a structure can also be provided in which the organic layers may be made common or shared as much as possible, and a color filter may be provided on the surface of the organic layers.

(Summary)

(1) A vapor deposition apparatus according to a first embodiment of the present invention comprises a mask holder for holding a deposition mask including a magnetic material; a substrate holder for holding a substrate for vapor deposition so as to dispose the substrate for vapor deposition in proximity to the deposition mask held by the mask holder; a vapor deposition source provided on a position facing a surface of the deposition mask opposite to the substrate for vapor deposition and spaced apart from the deposition mask, the vapor deposition source being adapted to vaporize or sublimate a vapor deposition material; and a magnet chuck provided on a position facing a surface of the substrate for vapor deposition held by a substrate holder, the surface being opposite to the deposition mask, the magnet chuck being adapted to attract the deposition mask by a magnetic force, wherein the magnet chuck comprises a permanent magnet and an electromagnet.

According to the vapor deposition apparatus of the embodiment in the present invention, the magnet chuck includes the permanent magnet and the electromagnet, so that the magnetic field of the permanent magnet can be weakened by the electromagnet when the substrate for vapor deposition or the like is attached or detached, or when the substrate for vapor deposition and the deposition mask are aligned with each other. Consequently, these works become very easy to perform, and an accurate deposition pattern can be obtained based on the precise alignment. In addition, heat generation from the electromagnet can also be reduced significantly.

(2) It is preferable that the permanent magnet and the electromagnet are arranged side by side in a direction perpendicular to an axial direction of the permanent magnet, and are connected together by a magnetic plate at surfaces of the permanent magnet and the electromagnet, opposite to surfaces thereof facing the deposition mask. With this structure, when the electromagnet is turned off, the polarity of the surface of the permanent magnet, opposite to the surface thereof facing the deposition mask, leads to the same surface as the surface of the permanent magnet facing the deposition mask via the core of the electromagnet, resulting in the same structure as the horseshoe-shaped permanent magnet, which can produce a strong magnetic field in the deposition mask.

(3) It is preferable that the magnetic plate is formed of a soft magnetic material because the residual magnetization due to the electromagnet is less likely to remain.

(4) The electromagnet may be provided to generate a magnetic field that is coaxial with respect to the axial direction of the permanent magnet. In this way, both types of magnets can be disposed without almost reducing the space for the arrangement of the conventional permanent magnets. In this case, without overlapping the permanent magnet and the electromagnet in the axial direction, an electromagnet can be formed by winding a coil around the permanent magnet, or by covering the outer periphery of the permanent magnet with a cylinder around which the coil is wound.

(5) The electromagnet has a control means for generating a magnetic field in a reverse orientation relative to an orientation of the magnetic field of the permanent magnet, so that the magnetic field of the permanent magnet can be weakened.

(6) It is preferable that a heat insulating member is interposed between a support plate and each of the mask holder and the substrate holder, the support plate supporting the mask holder and the substrate holder. In this way, the heat accumulation in the deposition mask is less likely to occur during alignment between the substrate for vapor deposition and the deposition mask even when the temperature of the substrate for vapor deposition increases, and when vapor deposition is continuously performed by replacing the substrate for vapor deposition.

(7) It is preferable that the vapor deposition apparatus further comprise a vacuum chamber containing the mask holder, the substrate holder, the vapor deposition source, and the magnet chuck; and a heat pipe, wherein a heat absorption part of the heat pipe is in contact with the magnet chuck, and a heat dissipation part of the heat pipe is guided out to an outside of the vacuum chamber. With this structure, even if the heat is generated in the magnet chuck, the heat conduction to the deposition mask or the like is suppressed.

(8) The heat absorption part of the heat pipe is partly embedded in a part of the magnet chuck, thereby increasing a contact area between the heat pipe and the magnet chuck, thus making it possible to effectively dissipate heat from the magnet chuck.

(9) By that the heat absorption part of the heat pipe is provided at a surface of the magnet chuck facing the substrate for vapor deposition, thus making it possible to further suppress the thermal conduction to the deposition mask.

(10) A vapor deposition method according to a second embodiment of the present invention comprises: a step of overlaying a deposition mask including a magnetic material, a substrate for vapor deposition, and a magnet chuck for attracting the deposition mask, and disposing the substrate for vapor deposition and the deposition mask in proximity to each other by the attraction of the deposition mask by using the magnet chuck; and a step of depositing a vapor deposition material on the substrate for vapor deposition by vaporizing or sublimating the vapor deposition material from a vapor deposition source spaced apart from the deposition mask, wherein the magnet chuck comprises a permanent magnet and an electromagnet, when the substrate for vapor deposition and the deposition mask are aligned with each other, the alignment is performed while applying a magnetic field in a reverse orientation relative to an orientation of the magnetic field of the permanent magnet by the electromagnet so as to weaken the magnetic field of the permanent magnet, and after the alignment, the deposition mask is attracted by the permanent magnet by turning off the magnetic field of the electromagnet.

According to a vapor deposition method of the second embodiment in the present invention, the attachment of the substrate for vapor deposition, or the alignment between the substrate for vapor deposition and the deposition mask can be performed without being almost influenced by the magnetic field. Consequently, these works become very easy to perform, and the alignment can also be surely performed. Further, during the vapor deposition, the deposition mask is attracted by the strong magnetic field generated by only the permanent magnet, so that with no heat generation, the contactability between the deposition mask and the substrate for vapor deposition is better. Thus, the vapor deposition material is deposited on the substrate for vapor deposition in the accurate pattern of the deposition mask.

(11) It is preferable that when the substrate for vapor deposition is attached or detached, the electromagnet is turned on to weaken the magnetic field of the permanent magnet because the work when the attachment or detachment can be made easier.

(12) It is preferred that the electromagnet is turned off by gradually decreasing a current therethrough, thereby making it possible to suppress the occurrence of an electromotive force due to electromagnetic induction.

(13) Further, a method of manufacturing an organic EL display apparatus according to a third embodiment of the present invention comprises: forming at least a TFT and a first electrode on a support substrate; forming an organic deposition layer by depositing organic materials over a surface of the support substrate using the vapor deposition method according to any one of paragraphs (10) to (12); and forming a second electrode on the organic deposition layer.

According to the method of manufacturing an organic EL display apparatus of the third embodiment in the present invention, the manufacturing work is easy to perform in the same manner as when the electromagnet is used as the magnet chuck, and the generation of heat from the magnet chuck can be reduced, so that the deposited layer can be obtained in the accurate pattern without being influenced by thermal expansion, while making the work easy to perform.

REFERENCE SIGNS LIST

1 Deposition mask
2 Substrate for vapor deposition
3 Magnet chuck
3A Permanent magnet
3B Electromagnet
4 Touch plate
5 Vapor deposition source
7 Heat pipe
8 Vacuum chamber
12 Metal support layer
15 Mask holder
21 Support substrate
22 First electrode
23 Insulating bank
25 Organic deposition layer
26 Second electrode
29 Substrate holder
35 Magnetic plate
66 Spacer (heat insulating member)
71 Heat absorption part
72 Heat dissipation part
73 Space
78 Protective pipe
80 Wick structure body
81 Case (container)
82 Wick
83 Wick core
84 Groove
96 Bellows

The invention claimed is:

1. A vapor deposition apparatus comprising:
a mask holder for holding a deposition mask including a magnetic material;
a substrate holder for holding a substrate for vapor deposition so as to dispose the substrate for vapor deposition in proximity to the deposition mask held by the mask holder;
a vapor deposition source provided on a position facing a surface of the deposition mask opposite to the substrate for vapor deposition and spaced apart from the deposition mask, the vapor deposition source being adapted to vaporize or sublimate a vapor deposition material; and
a magnet chuck provided on a position facing a surface of the substrate for vapor deposition held by the substrate holder, the surface being opposite to the deposition mask, the magnet chuck being adapted to attract the deposition mask by a magnetic force,
wherein the magnet chuck comprises a permanent magnet and an electromagnet, and the permanent magnet and the electromagnet are arranged such that the permanent magnet is opposed to the substrate for vapor deposition, the substrate for vapor deposition being held by the substrate holder, and the permanent magnet and the electromagnet are arranged in the axial direction, the surrounding thereof being fixed by a covering material; and
wherein a heat pipe is provided such that a heat absorption part of the heat pipe contacts a surface opposite to the permanent magnet.

2. A vapor deposition apparatus comprising:
a mask holder for holding a deposition mask including a magnetic material;
a substrate holder for holding a substrate for vapor deposition so as to dispose the substrate for vapor deposition in proximity to the deposition mask held by the mask holder;
a vapor deposition source provided on a position facing a surface of the deposition mask opposite to the substrate for vapor deposition and spaced apart from the deposition mask, the vapor deposition source being adapted to vaporize or sublimate a vapor deposition material; and
a magnet chuck provided on a position facing a surface of the substrate for vapor deposition held by the substrate holder, the surface being opposite to the deposition mask, the magnet chuck being adapted to attract the deposition mask by a magnetic force, wherein the magnet chuck comprises a permanent magnet and an electromagnet, and the electromagnet is formed by winding a coil around the permanent magnet.

3. A vapor deposition apparatus comprising:
a mask holder for holding a deposition mask including a magnetic material;
a substrate holder for holding a substrate for vapor deposition so as to dispose the substrate for vapor deposition in proximity to the deposition mask held by the mask holder;
a vapor deposition source provided on a position facing a surface of the deposition mask opposite to the substrate for vapor deposition and spaced apart from the deposition mask, the vapor deposition source being adapted to vaporize or sublimate a vapor deposition material; and
a magnet chuck provided on a position facing a surface of the substrate for vapor deposition held by the substrate holder, the surface being opposite to the deposition mask, the magnet chuck being adapted to attract the deposition mask by a magnetic force,
wherein the magnet chuck comprises a permanent magnet and an electromagnet, and the electromagnet is formed by covering the outer periphery of the permanent magnet with a cylinder around which the coil is wound.

4. The vapor deposition apparatus of claim 1, wherein the electromagnet has a control means for generating a magnetic field in a reverse orientation relative to an orientation of the magnetic field of the permanent magnet.

5. The vapor deposition apparatus of claim 2, wherein the electromagnet has a control means for generating a magnetic field in a reverse orientation relative to an orientation of the magnetic field of the permanent magnet.

6. The vapor deposition apparatus of claim 3, wherein the electromagnet has a control means for generating a magnetic field in a reverse orientation relative to an orientation of the magnetic field of the permanent magnet.

7. The vapor deposition apparatus of claim 1, wherein a heat insulating member is interposed between a support plate and each of the mask holder and the substrate holder, the support plate supporting the mask holder and the substrate holder.

8. The vapor deposition apparatus of claim 2, wherein a heat insulating member is interposed between a support plate and each of the mask holder and the substrate holder, the support plate supporting the mask holder and the substrate holder.

9. The vapor deposition apparatus of claim 3, wherein a heat insulating member is interposed between a support plate and each of the mask holder and the substrate holder, the support plate supporting the mask holder and the substrate holder.

10. The vapor deposition apparatus of claim 2, further comprising:
a vacuum chamber containing the mask holder, the substrate holder, the vapor deposition source, and the magnet chuck; and
a heat pipe,
wherein a heat absorption part of the heat pipe is in contact with the magnet chuck, and a heat dissipation part of the heat pipe is guided out to an outside of the vacuum chamber.

11. The vapor deposition apparatus of claim 3, further comprising:
a vacuum chamber containing the mask holder, the substrate holder, the vapor deposition source, and the magnet chuck; and
a heat pipe,
wherein a heat absorption part of the heat pipe is in contact with the magnet chuck, and a heat dissipation part of the heat pipe is guided out to an outside of the vacuum chamber.

12. A vapor deposition method comprising:
a step of overlaying a deposition mask including a magnetic material, a substrate for vapor deposition, and a magnet chuck for attracting the deposition mask, and disposing the substrate for vapor deposition and the deposition mask in proximity to each other by the attraction of the deposition mask by using the magnet chuck by using the vapor deposition apparatus of claim 1; and
a step of depositing a vapor deposition material on the substrate for vapor deposition by vaporizing or sublimating the vapor deposition material from a vapor deposition source spaced apart from the deposition mask,
wherein the magnet chuck comprises a permanent magnet and an electromagnet, when the substrate for vapor deposition and the deposition mask are aligned with each other, the alignment is performed while applying a magnetic field in a reverse orientation relative to an orientation of a magnetic field of the permanent magnet by using the electromagnet so as to weaken the magnetic field of the permanent magnet, and after the alignment, the deposition mask is attracted by the permanent magnet by turning off the magnetic field of the electromagnet.

13. A vapor deposition method comprising:
a step of overlaying a deposition mask including a magnetic material, a substrate for vapor deposition, and a magnet chuck for attracting the deposition mask, and disposing the substrate for vapor deposition and the deposition mask in proximity to each other by the attraction of the deposition mask by using the magnet chuck by using the vapor deposition apparatus of claim 2; and
a step of depositing a vapor deposition material on the substrate for vapor deposition by vaporizing or sublimating the vapor deposition material from a vapor deposition source spaced apart from the deposition mask,
wherein the magnet chuck comprises a permanent magnet and an electromagnet, when the substrate for vapor deposition and the deposition mask are aligned with each other, the alignment is performed while applying a magnetic field in a reverse orientation relative to an orientation of a magnetic field of the permanent magnet by using the electromagnet so as to weaken the magnetic field of the permanent magnet, and after the alignment, the deposition mask is attracted by the permanent magnet by turning off the magnetic field of the electromagnet.

14. A vapor deposition method comprising:
a step of overlaying a deposition mask including a magnetic material, a substrate for vapor deposition, and a magnet chuck for attracting the deposition mask, and disposing the substrate for vapor deposition and the deposition mask in proximity to each other by the attraction of the deposition mask by using the magnet chuck by using the vapor deposition apparatus of claim 3; and
a step of depositing a vapor deposition material on the substrate for vapor deposition by vaporizing or sublimating the vapor deposition material from a vapor deposition source spaced apart from the deposition mask, wherein the magnet chuck comprises a permanent magnet and an electromagnet, when the substrate for vapor deposition and the deposition mask are aligned with each other, the alignment is performed while applying a magnetic field in a reverse orientation relative to an orientation of a magnetic field of the permanent magnet by using the electromagnet so as to weaken the magnetic field of the permanent magnet, and after the alignment, the deposition mask is attracted by the permanent magnet by turning off the magnetic field of the electromagnet.

15. A method of manufacturing an organic EL display apparatus, comprising:

forming at least a TFT and a first electrode on a support substrate;

forming an organic deposition layer by depositing organic materials over a surface of the support substrate using the vapor deposition method according to claim 12; and forming a second electrode on the organic deposition layer.

16. A method of manufacturing an organic EL display apparatus, comprising:

forming at least a TFT and a first electrode on a support substrate;

forming an organic deposition layer by depositing organic materials over a surface of the support substrate using the vapor deposition method according to claim 13; and forming a second electrode on the organic deposition layer.

17. A method of manufacturing an organic EL display apparatus, comprising:

forming at least a TFT and a first electrode on a support substrate;

forming an organic deposition layer by depositing organic materials over a surface of the support substrate using the vapor deposition method according to claim 14; and forming a second electrode on the organic deposition layer.

* * * * *